(12) United States Patent
Shimada et al.

(10) Patent No.: US 6,764,323 B2
(45) Date of Patent: Jul. 20, 2004

(54) CARD SLOT ASSEMBLY WITH MEANS FOR PREVENTING INSERTION OF ERRONEOUS CARD HAVING THICKNESS SMALLER THAN CORRECT CARD

(75) Inventors: Masaaki Shimada, Hamura (JP); Keisuke Nakamura, Akishima (JP)

(73) Assignee: Japan Aviation Eletronics Industry, Limited, Tokyo (JP)

( * ) Notice: Subject to any disclaimer, the term of this patent is extended or adjusted under 35 U.S.C. 154(b) by 0 days.

(21) Appl. No.: 10/650,351

(22) Filed: Aug. 28, 2003

(65) Prior Publication Data
US 2004/0087212 A1 May 6, 2004

(30) Foreign Application Priority Data
Aug. 28, 2002 (JP) .................................. 2002/249231

(51) Int. Cl.⁷ ............................................. H01R 24/00
(52) U.S. Cl. .................... 439/138; 439/159; 439/64; 439/681; 439/377; 439/630
(58) Field of Search ............................. 439/135–138, 439/630–631, 159, 64, 377, 681

(56) References Cited

U.S. PATENT DOCUMENTS

| 5,408,384 A | * | 4/1995 | Gannyo et al. ............. 361/737 |
| 5,899,763 A | * | 5/1999 | Kajiura ....................... 439/159 |
| 6,390,836 B1 | * | 5/2002 | Motegi et al. .............. 439/159 |

* cited by examiner

Primary Examiner—Truc Nguyen
(74) Attorney, Agent, or Firm—Collard & Roe, P.C.

(57) ABSTRACT

If a PC card is inserted into a card slot for the PC card, both of button portions are pressed by the PC card. When the both of the button portions are pressed outwardly in the Z-direction, both of engagement portions are released from engagement recesses, respectively, so that a stopper is allowed to move in a space to permit the PC card to be inserted into the card slot. Otherwise, the stopper is still locked at a position shown in the drawing, by at least one of the engagement portions to prevent an erroneous card having a thickness smaller than the PC card from being inserted into the card slot.

11 Claims, 24 Drawing Sheets

CARD SLOT ASSEMBLY WITH MEANS FOR PREVENTING INSERTION OF ERRONEOUS CARD HAVING THICKNESS SMALLER THAN CORRECT CARD

This application claims priority to prior Japanese patent application JP 2002-249231, the disclosure of which is incorporated herein by reference.

BACKGROUND OF THE INVENTION

The present invention relates to a card slot assembly which is able to receive one or more cards.

There are some kinds of cards, each of which has a shape similar to others. For example, one type of smart cards is similar to a PC card except for its thickness. Since the PC card is thicker than the smart card, the PC card cannot be inserted into a card slot for the smart card. However, sometimes the smart card is inserted into a card slot for the PC card by error.

SUMMARY OF THE INVENTION

It is an object of the present invention to provide a card slot assembly which can prevent an unsuitable card from being inserted into a card slot.

According to this invention, a card slot assembly receivable a card is obtained, which comprises a frame, stopper means, and button means. The frame is provided with a guide groove. The guide groove is arranged at an inner side of the frame in a first direction and extends in a second direction perpendicular to the first direction, and the guide groove is formed with an accommodation space. The accommodation space is outwardly depressed in the first direction. The stopper means is movably held by the frame and is movable within a movable range between first and second positions. The first position is a position where the stopper means traverses the guide groove in a third direction perpendicular to the first and the second directions. The second position is a position where the stopper means is accommodated in the accommodation space. The button means is positioned in the guide groove and is linked with the stopper means, so that, when the button means is pressed, the stopper means is moved to the second position.

In an embodiment of this invention, the button means may preferably be comprised of two button portions, which are opposite to each other in the third direction. The stopper means is allowed to move to the second position only when both of the button portions are pressed.

In a preferred embodiment, the card slot assembly according this invention is able to receive a first type card and a second type card, the first type card being thicker than the second types card, wherein the guide groove is for guiding insertion of the first type card, and the button portions are positioned apart from each other in the third direction by a predetermined distance, which is larger than a thickness of the second type card.

Further objects, features and advantages of the present invention are comprehensible from the following description of embodiments of the invention in connection with the drawings attached hereto.

DESCRIPTION OF PREFERRED EMBODIMENTS

Figure 1:
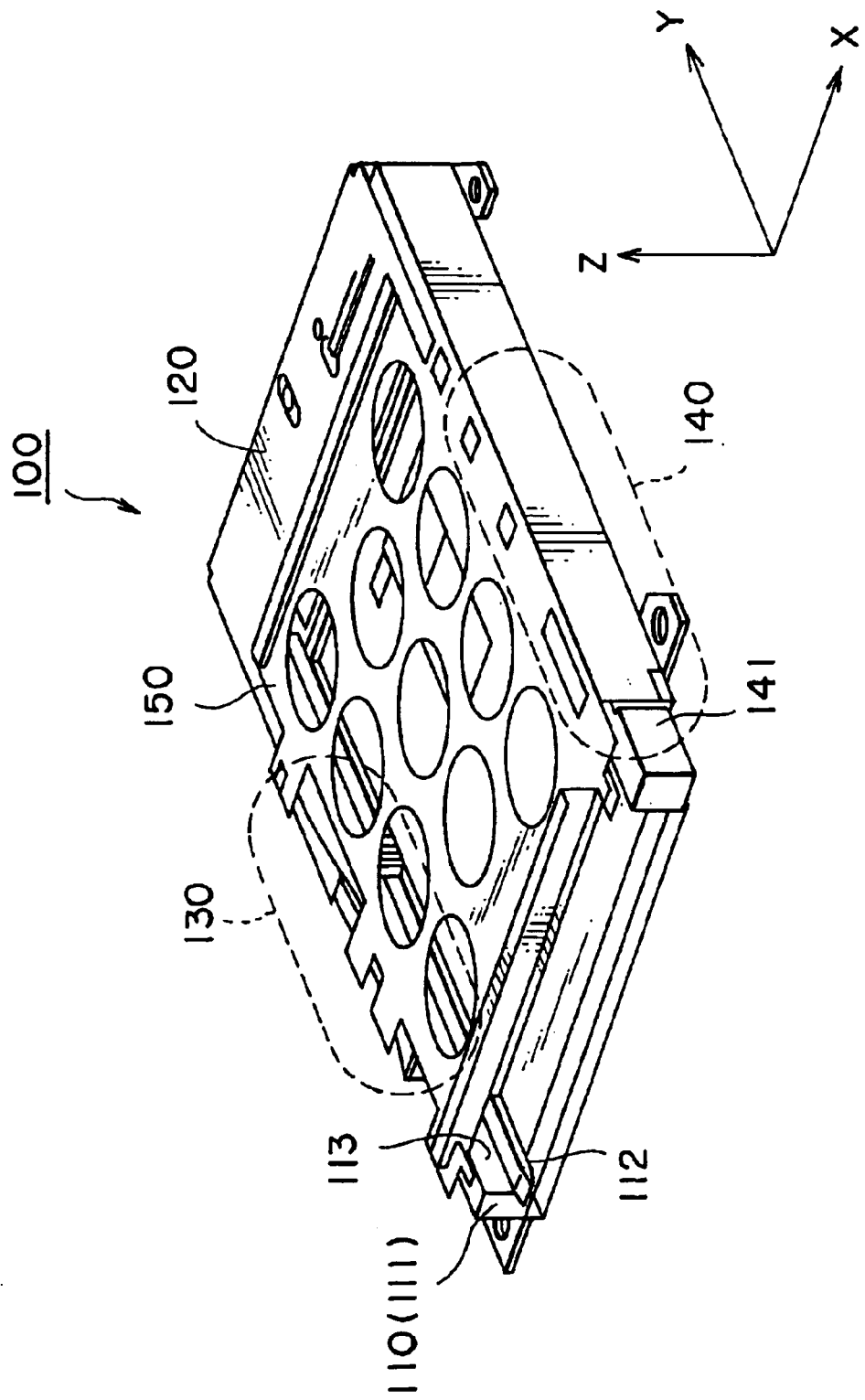
FIG. 1 is a perspective view showing a card slot assembly according to a first embodiment of the present invention.
Figure 2:
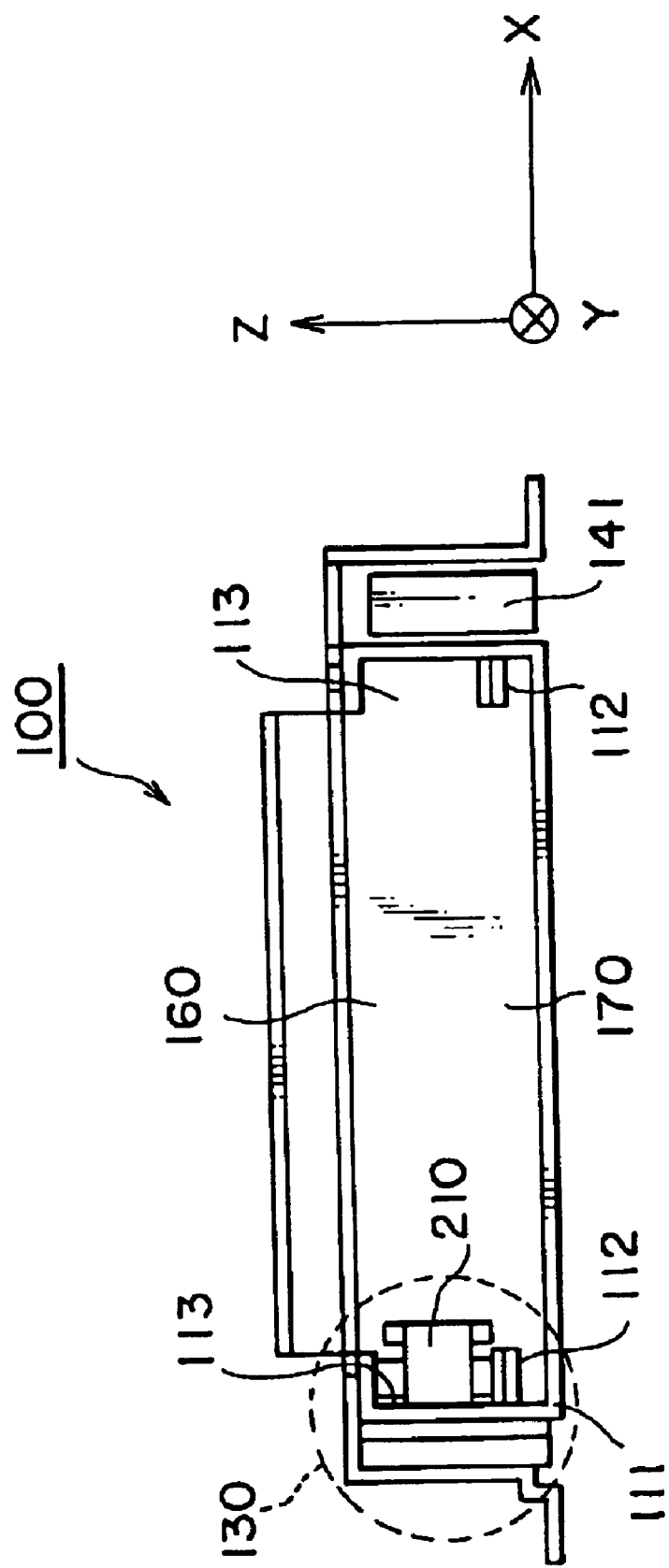
FIG. 2 is a rear view showing the card slot assembly of FIG. 1.

With reference to FIGS. 1 and 2, a card slot assembly 100 according to a first embodiment of the present invention is able to receive different types of cards, one of which is a smart card, and the other is a PC card. In this embodiment, the smart card has a shape similar to the PC card except for its thickness. The PC card is three times or more thick than that of the smart card.

As shown in FIG. 1, the card slot assembly 100 comprises a frame 110. Onto the front of the frame 110, an insulator 120 is fitted. The insulator 120 is provided with a plurality of contacts, which are to be in contact with terminals of the PC card but are not shown in the drawings. At a right side portion of the frame 110, a card ejection mechanism 140 including an ejection bar 141 is provided. In a left side portion 111 of the frame 110, a prevention mechanism 130 of insertion of an unsuitable card is partially contained. Over the frame 110, a cover 150 is fitted.

As shown in FIG. 2, on the opposite sides of the frame 110 in an X-direction, guide portions 112 are provided. The guide portions 112 define guide grooves 113, respectively, in the frame 110. Each of the guide portions 112 has a shape like a narrow plate which extends in a Y-direction perpendicular to the X-direction. Accordingly, the guide grooves 113 also extend in the Y-direction, respectively. Each of the guide grooves 113 has a C-like cross-section in a plane perpendicular to the Y-direction, wherein each of the C-like cross-sections of the guide grooves 113 opens towards the inside of the side portions of the frame 110 in the X-direction.

As shown in FIG. 2, the guide portions 112 divide the rear end of the card slot assembly 100 into two card slots 160, 170. The upper card slot 160 is a card slot for the PC card, while the lower card slot 170 is a card slot for the smart card. The guide grooves 113 are for guiding the opposite sides of the PC card inserted into the card slot 160. At a certain position on the guide groove 113, the prevention mechanism 130 is arranged.

Figure 4:
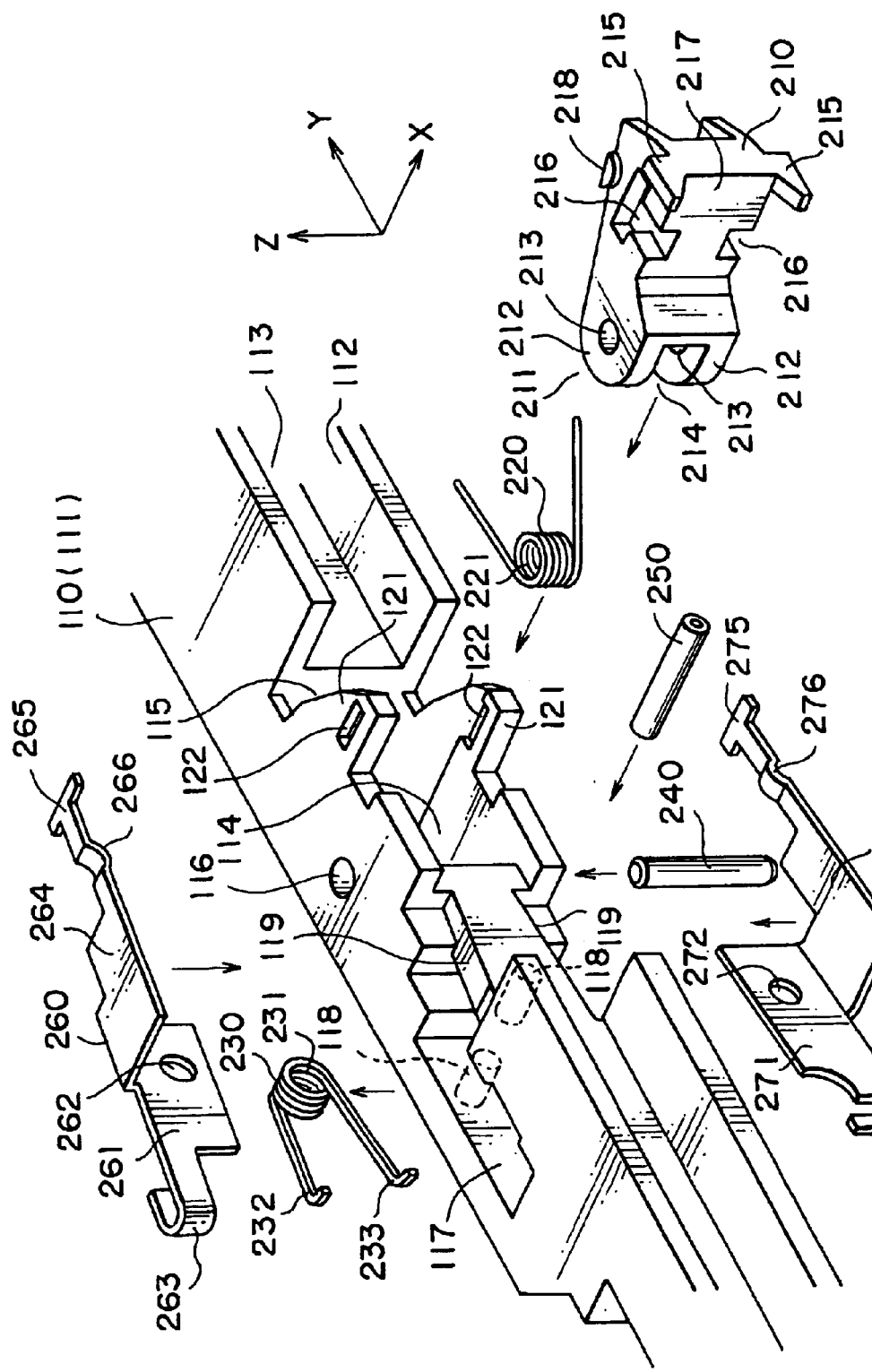
FIG. 4 is an exploded, perspective view showing the mechanism of FIG. 3.

As shown in FIG. 4, the side portion 111 of the frame 110 is formed with first and second rooms 114, 115, which communicate with each other and are depressed outwardly from the guide groove 113 in the X-direction. The first room 114 also communicates with a pair of holes 116 which extend in a Z-direction perpendicular to the X- and the Y-directions.

As shown in FIG. 4, the side portion 111 of the frame 110 is also formed with a third room 117, which is apart from the first and the second rooms 114, 115 in the Y-directions and is positioned at the outside of the guide groove 113 in the X-direction. The third room 117 communicates with a pair of holes 118, which extend in the X-direction. At positions between the first and the third rooms 114, 117 in the Y-direction and between the third room 117 and the guide groove 113 in the X-direction, a pair of seat portions 119 are formed in the side portion 111 of the frame 110.

From the opposite sides of the second room 115 in the Z-direction, a pair of tab portions 121 project in the X-direction. Each of the tab portions 121 has a quarter-oval like shape which has a straight edge and a curved edge which is positioned farther from the rear end of the card slot assembly 100 than the straight edge. The each of the tab portions 121 is formed with a pocket 122, which communicates between the guide groove 113 and the outside of the frame 110 in the Z-direction.

With reference to FIGS. 3 to 8, the prevention mechanism 130 comprises a single stopper 210, first and second torsion springs 220, 230, first and second shafts 240, 250, and first and second parts 260, 270.

As shown in FIG. 4, the stopper 210 has a supported end 211 comprised of two plate portions 212. Each of the plate portions 212 is formed with a hole 213. The plate portions 212 define a space 214 therebetween. The other end of the stopper 210 is formed with a pair of projections 215, which project outwardly in the Z-direction. Between the supported end 211 and the projections 215, a pair of engagement recesses 216 are formed in the stopper 210. Each of the engagement recesses 216 has a T-like shape. The engagement recesses 216 continue to a pressed surface 217. The stopper 210 is further provided with a pair of small projections 218, which project outwardly in the Z-direction. The small projections 218 are positioned farther from the pressed surface 217 than the engagement recesses 216.

Figure 5:
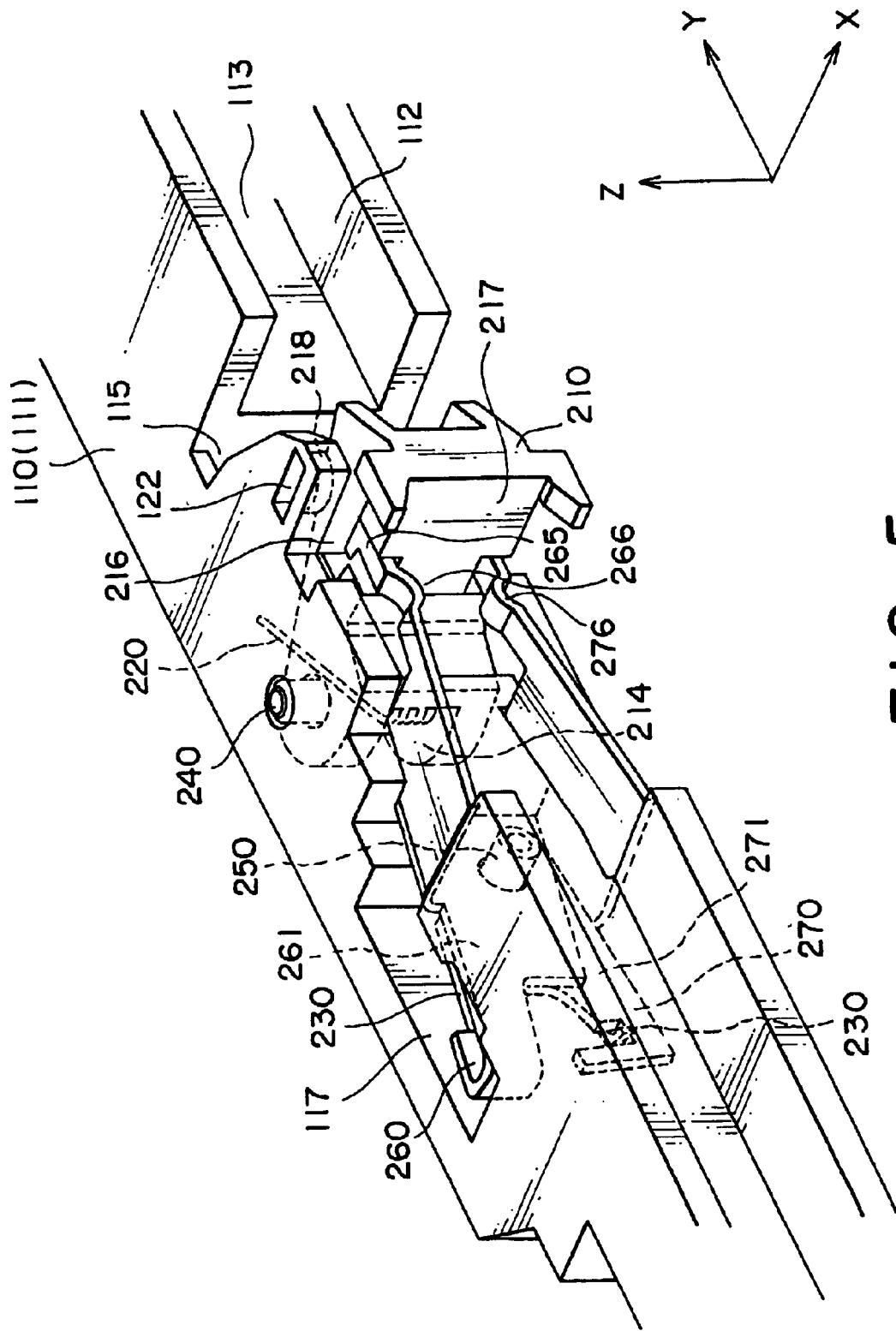
FIG. 5 is a partially-transparent, perspective view showing the mechanism of FIG. 3.

As shown in FIGS. 4 and 5, within the space 214 between the plate portions 212, the first torsion spring 220 is disposed so that the holes 213 are aligned with a hole 221 of the first torsion spring 220. The combination of the first torsion spring 220 and the supported end 211 of the stopper 210 is inserted into the first room 114 of the side portion 111 of the frame 110. The holes 116 are aligned with the hole 221 of the first torsion spring 220 and the holes 213 of the stopper 210 by the first shaft 240 inserted thereinto. Thus, the stopper 210 is rotatably supported by the first shaft 240.

Figure 3:
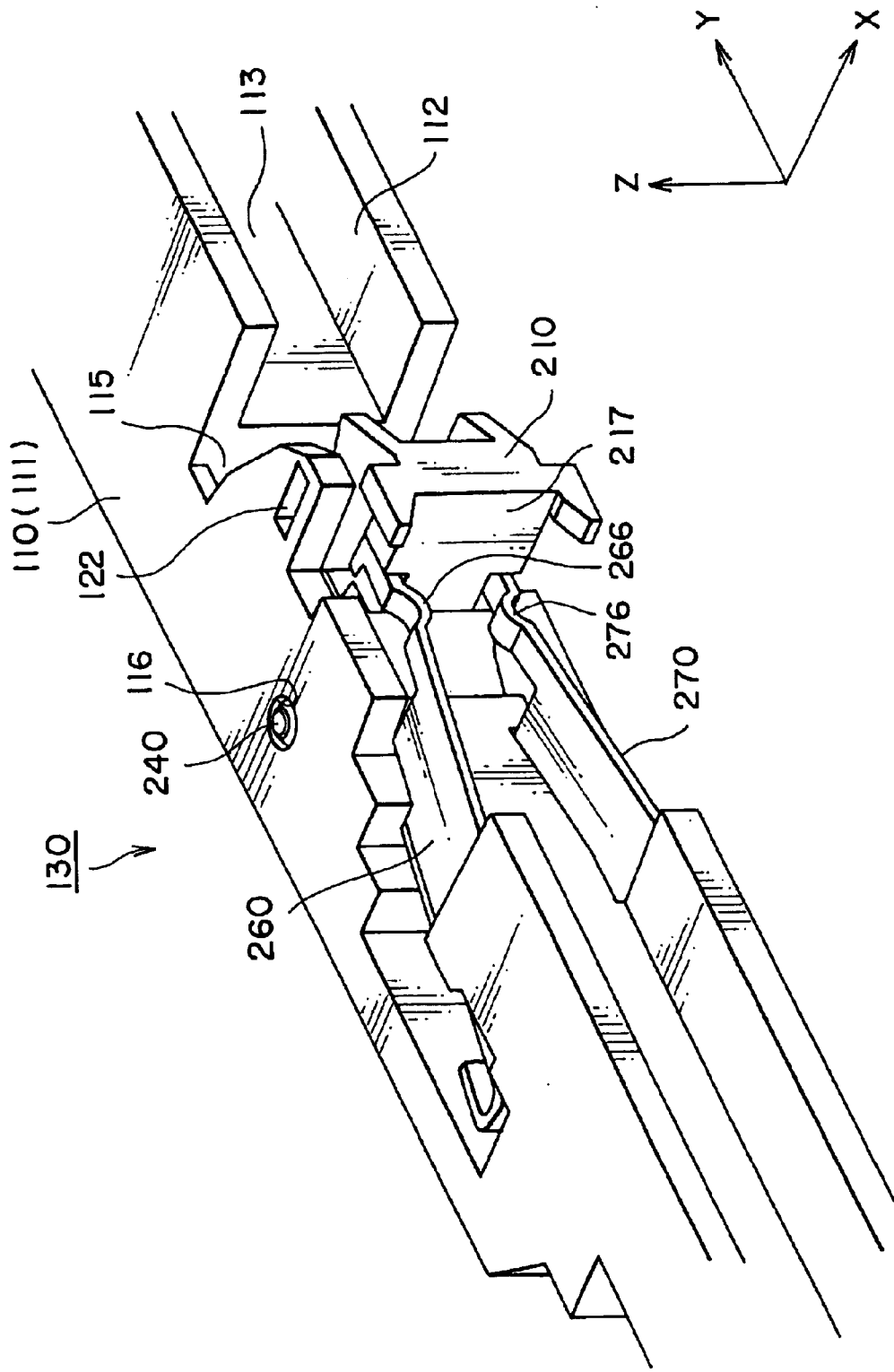
FIG. 3 is a partial, enlarged, perspective view showing a prevention mechanism of insertion of an unsuitable card, the mechanism being included in the card slot assembly of FIG. 1.
Figure 7:
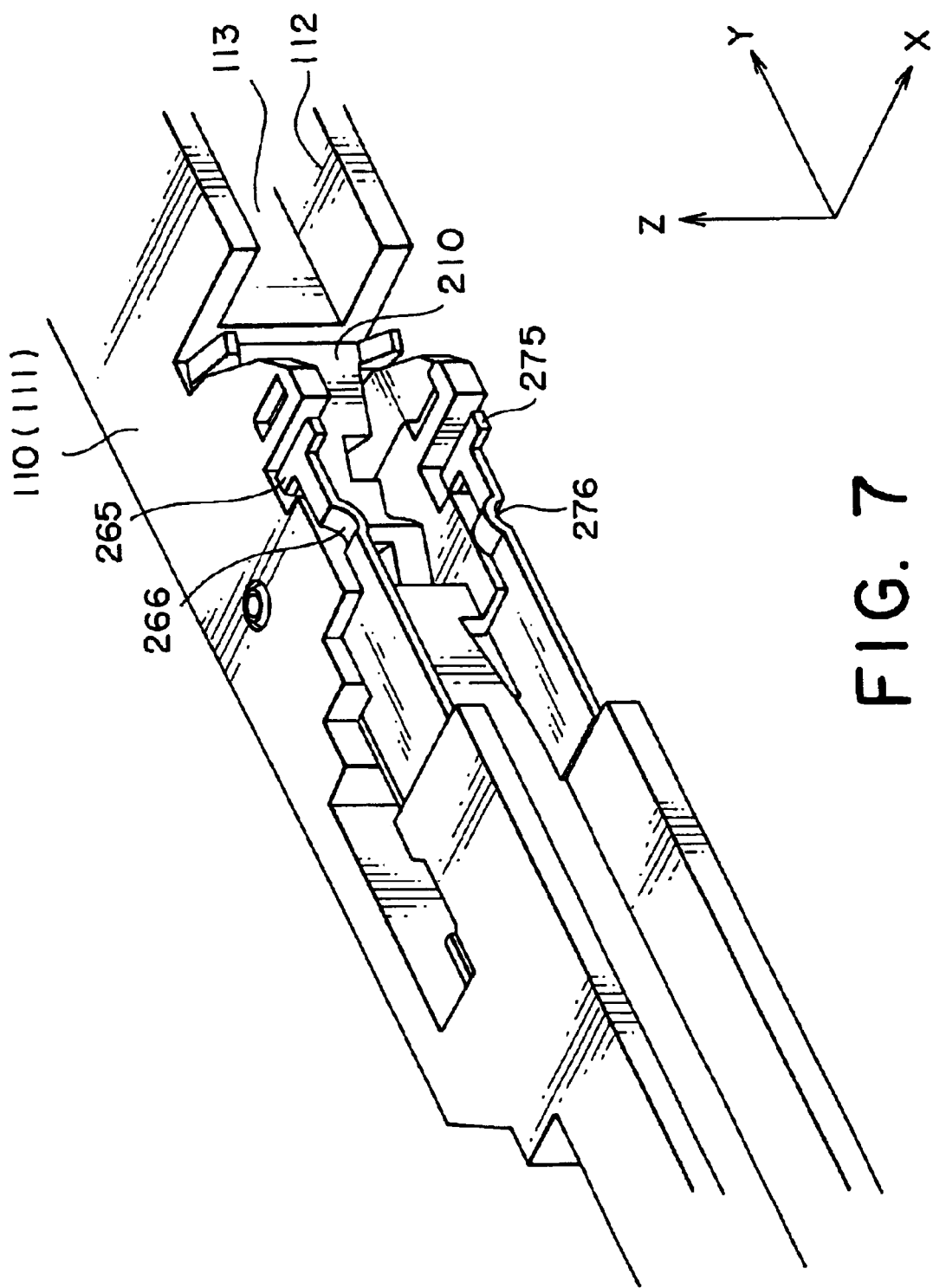
FIG. 7 is a perspective view showing the mechanism of FIG. 3, wherein a stopper is moved.

The stopper 210 is able to move between a position shown in FIG. 3 and a position shown in FIG. 7. The former position is referred to as a first position, while the latter position is referred to as a second position. When the stopper 210 moves between the first and the second positions, the projections 215 move along the curved edges of the tab portions 121 of the frame 110.

As shown in FIGS. 3 and 5, when the stopper 210 is positioned at the first position, the small projections 218 of the stopper 210 are fitted within the pockets 122, and the pressed surface 217 is laid on a plane perpendicular to the Y-direction, i.e. a plane perpendicular to a card insertion direction. In this embodiment, the pockets 122 and the projections 218 regulate the position of the stopper 210 so that the stopper 210 does not move over the first position toward the rear end of the card slot assembly 100. In this meaning, the combination of the pockets 122 and the projections 218 serve as regulating means for regulating the movement of the stopper 210 to prevent the stopper from moving over the first position.

In this embodiment, the guide groove 113 is completely blocked off by the stopper 210 when the stopper 210 is positioned at the first position, as shown in FIG. 3. For the purpose of the present invention, it is sufficient that the stopper 210 transverses the guide groove 113 in the Z-direction so that the stopper 210 can stop the insertion of an unsuitable card, for example, the smart card against the card slot 160 for the PC card. Taking this into consideration, the shape of the stopper 210 may be selected from various other shapes.

As shown in FIG. 7, when the stopper 210 is positioned at the second position, the stopper 210 is accommodated in the first and the second rooms 114, 115 so that the stopper 210 is not an obstacle within the guide groove 113 any longer.

As shown in FIGS. 3 and 5, the stopper 210 is locked at the first position by a combination of the second torsion spring 230, the second shaft 250, and the first and second parts 260, 270. As shown in FIG. 4, the second torsion spring 230 has a hole 231 and two arms 232, 233.

As shown in FIG. 4, the first part 260 has a fixed portion 261, which is formed with a hole 262. The fixed portion 261 is to be rotatably fixed in the side portion 111, as described in detail afterwards. The free end 263 of the fixed portion 261 has U-like shape. From the fixed portion 261, a rotation arm 264 extends mainly in the Y-direction. At a position nearer to the hole 262 than the end 263, the fixed portion 261 and the rotation arm 264 make a right angle with each other.

On the free end of the rotation arm 264, an engagement portion 265 is formed. The engagement portion 265 has a T-like shape, which corresponds to one of the engagement recesses 216 of the stopper 210. Between the engagement portion 265 and the connection point of the fixed portion 261 and the rotation arm 264, a button portion 266 is formed. The button portion 266 projects towards the inside of the guide groove 113 in the Z-direction.

As shown in FIG. 4, the second part 270 has a fixed portion 271, which is formed with a hole 272. The fixed portion 271 is also to be rotatably fixed in the side portion 111, as described in detail afterwards. At the free end of the fixed portion 261, a hooked portion 273 is formed. From the fixed portion 271, a rotation arm 274 extends mainly in the Y-direction. At a position nearer to the hole 272 than the hooked portion 273, the fixed portion 271 and the rotation arm 274 make a right angle with each other. On the free end of the rotation arm 274, an engagement portion 275 is formed. The engagement portion 275 has a T-like shape, which corresponds to one of the engagement recesses 216 of the stopper 210. Between the engagement portion 275 and the connection point of the fixed portion 271 and the rotation arm 274, a button portion 276 is formed. The button portion 276 projects towards the inside of the guide groove 113 in the Z-direction.

As shown in FIG. 5, the second torsion spring 230 and the fixed portions 261, 271 of the first and second parts 260, 270 are accommodated in the third room 117 of the side portion 111 of the frame 110. As seen from the outside of the frame 110 in the X-direction, the second torsion spring 230, the fixed portion 261 of the first part 260, and the fixed portion 271 of the second part 270 are arranged in this order. The holes 262, 272 of the first and the second parts 260, 270 and the hole 231 of the second torsion spring 230 are aligned with the pair of holes 118 by the second shaft 250 inserted thereto. Thus, the first and the second parts 260, 270 are rotatably supported by the second shaft 250. The first arm 232 of the second torsion spring 230 is hooked on the end 263 of the first part 260. The second arm 233 of the second torsion spring 230 is hooked on the hooked portion 273 of the second part 270. With the above structure, the second torsion spring 230 forces the end 263 of the first part 260 and the hooked portion 273 of the second part 270 to be away from each other. On the other hands, the engagement portions 265, 275 of the first and the second parts 260, 270 are forced to be close to each other by the second torsion spring 230.

As seen from the above explanation and FIGS. 4 and 5, the second torsion spring 230, the second shaft 250, and the first and the second parts 260, 270 constitute a catching device like a clothes peg. When the catching device closes, the engagement portions 265, 275 engage with the engagement recesses 216. By the engagements, the stopper 210 is locked at the first position. In this meaning, the engagement portions 265, 275 serve as locking means for locking the stopper 210 at the first position. Under the locked state, the stopper 210 cannot be moved from the first position even if the stopper 210 receives a force on the pressed surface 217.

As shown in FIG. 5, the button portions 266, 276 face each other in the Z-direction. The minimum distance between the button portions 266, 276 are controlled by the seat portions 119 of the side portion 111 of the frame 110, as seen from FIGS. 4 and 5. In detail, when the engagement portions 265, 275 engage with the engagement recesses 216, the arm portions 264, 274 sit on the seat portions 119. At that time, the distance between the button portions 266, 276 become minimum one.

Figure 6:
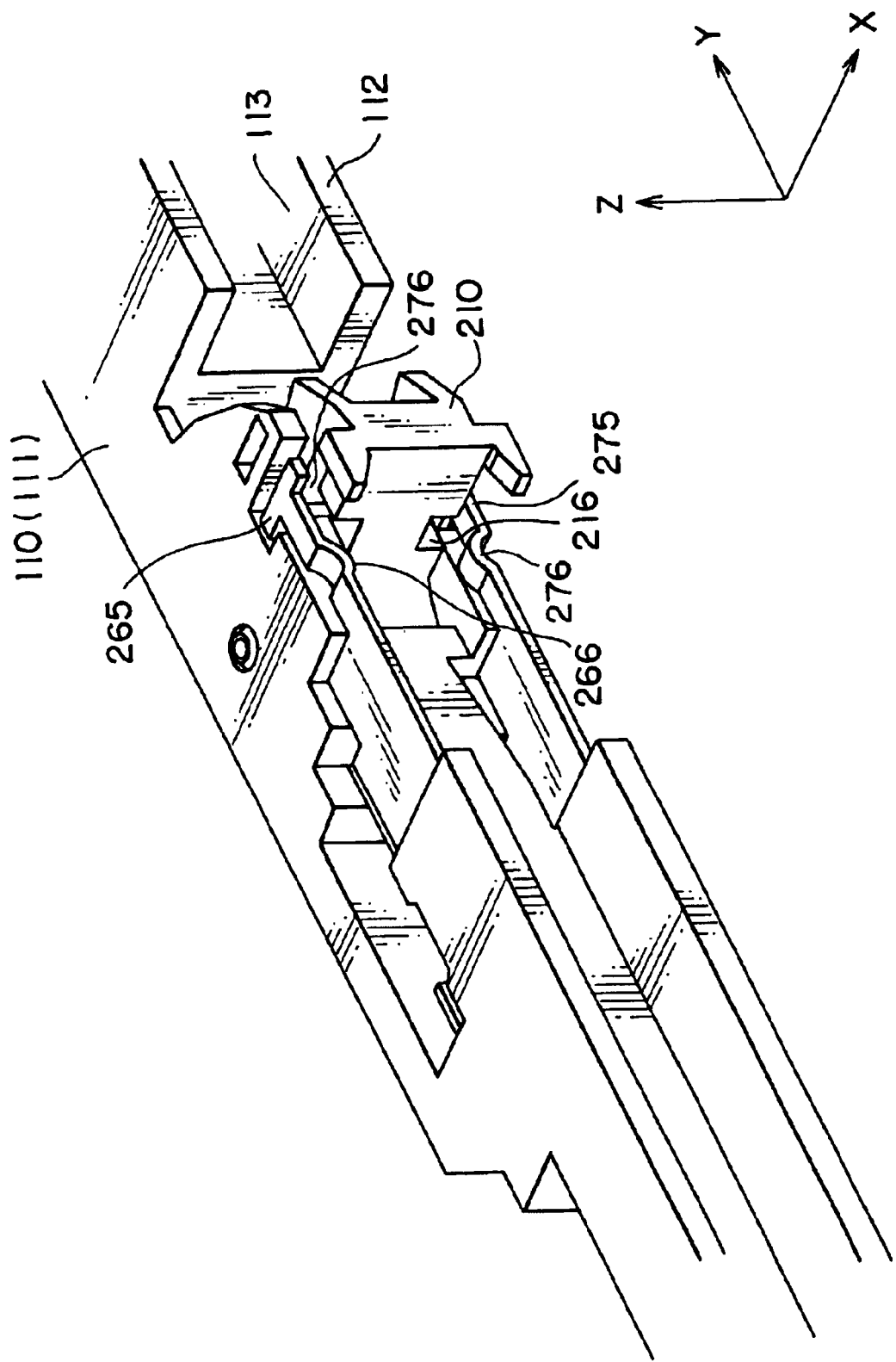
FIG. 6 is a perspective view showing the mechanism of FIG. 3, wherein a stopper is unlocked.

In this embodiment, the minimum distance between the button portions 266, 276 is larger than the thickness of the smart card but is smaller than the thickness of the PC card. Therefore, if the PC card is inserted into the card slot 160, both of the button portions 266, 276 are pressed by the PC card. As shown in FIG. 6, when the both of the button portions 266, 276 are pressed outwardly from the guide groove 113 in the Z-direction, both of the engagement portions 265, 275 are released from the engagement recesses 216, respectively, so that the stopper 210 is allowed to move towards the second position. Otherwise, the stopper 210 is still locked at the first position by at least one of the engagement portions 265, 275.

If both of the engagement portions 265, 275 are released from the engagement recesses 216, when the PC card is further inserted along the guide groove 113, the stopper 210 is pressed by the PC card and is moved to the second position, as shown in FIG. 7. As explained above, when the stopper 210 is positioned at the second position, the stopper 210 does not obstruct the guide groove 113 so that the PC card can be further inserted and be received in the card slot assembly 100.

Figure 8:
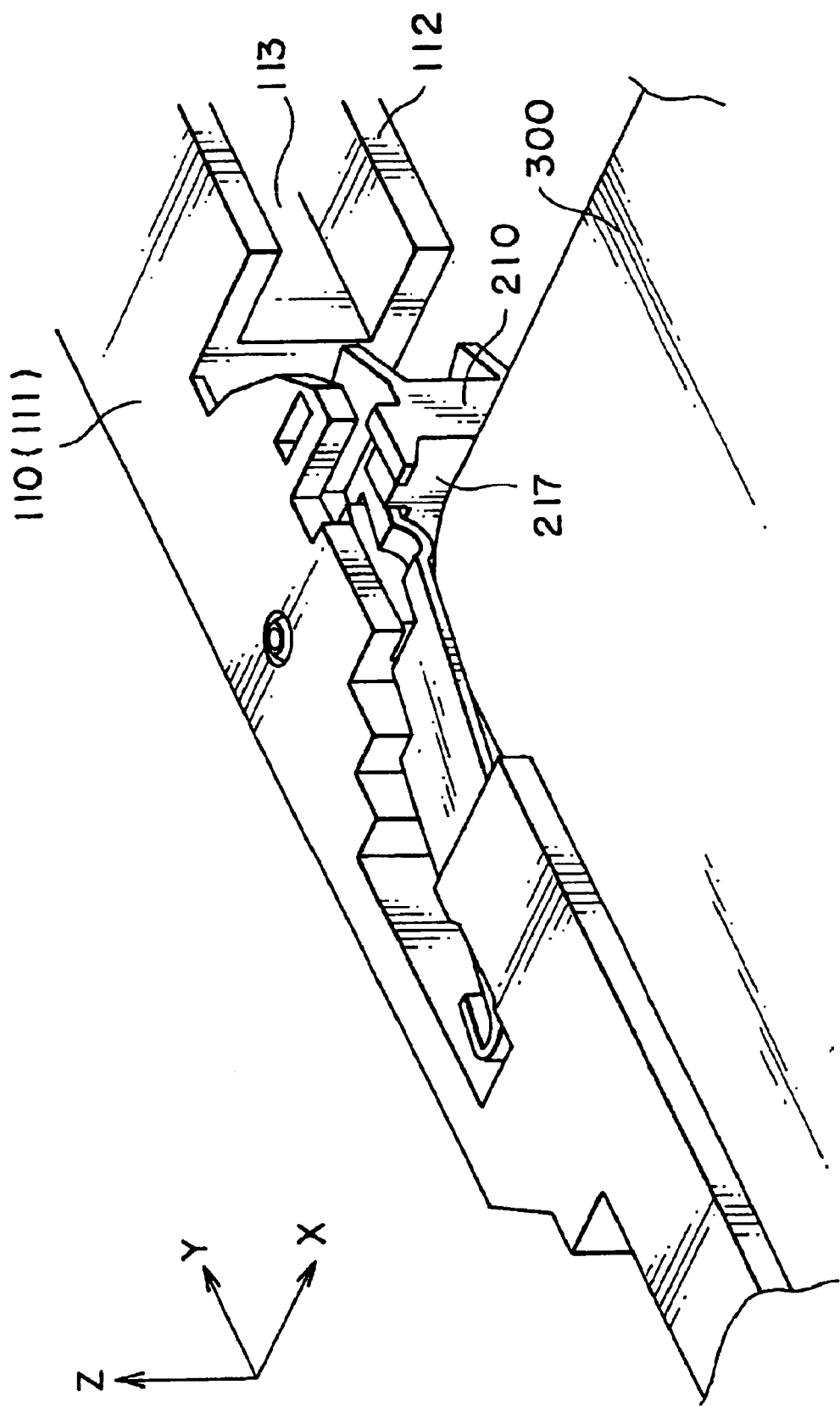
FIG. 8 is a perspective view showing the mechanism of FIG. 3, wherein insertion of an unsuitable card is stopped by the stopper.

As shown in FIG. 8, even if the smart card 300 is inserted along the guide groove 113 by error, the smart card 300 cannot press both of the button portions 266, 276 simultaneously because of the relationship between the thickness of the smart card 300 and the minimum distance between the button portions 266, 276. Therefore, the stopper 210 is still locked at the first position. In this locked state, the smart card 300 is received by the pressed surface 217 of the stopper 210 and is prevented from entering over the stopper 210.

With reference to FIGS. 9 to 14, a mechanism 400 according to a second embodiment of the present invention is similar to the first embodiment except that a stopper 430 is formed integral with the locking means.

Figure 10:
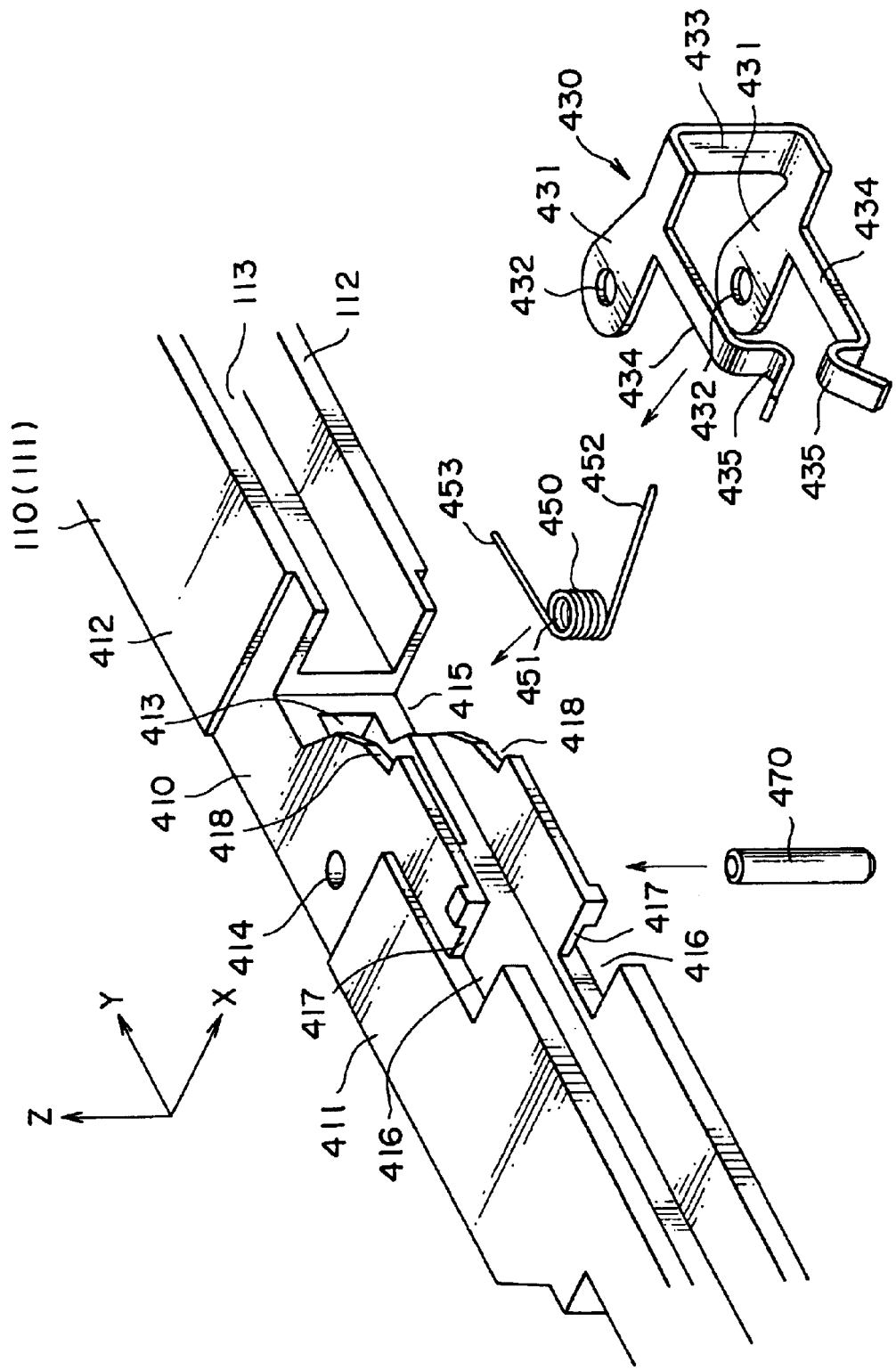
FIG. 10 is an exploded, perspective view showing the mechanism of FIG. 9.

As shown in FIG. 10, on the opposite surfaces of the side portion 111 of the frame 110 in the Z-direction, there are depressed portions 410 which are depressed towards the inside of the side portion 111 in the Z-direction in comparison with the other parts 411, 412 of the side portion 111. Between the depressed portions 410, a room 413 is formed in the side portion 111 of the frame 110. The room 413 communicates with a pair of holes 414, which extend in the Z-direction. Between the rooms and the guide groove 113 in the X-direction, there is a space 415, which can accommodate a part of the stopper 430 as described afterwards. On the rear end positions of the depressed portions 410 in the Y-direction, cut-away like portions 416 are formed in the side portion 111 of the frame 110. Each of the cut-away like portions 416 continues from the corresponding depressed portion 410 to the guide groove 113. The cut-away like portions 416 serve as engagement portions, as described afterwards.

As shown in FIG. 10, the stopper 430 comprises two plate portions 431. The plate portions 431 are apart from each other in the Z-direction. Near one end of each plate portion 431, a hole 432 is formed. The plate portions 431 are connected to each other by a stopper portion 433, which extends in the Z-direction. From each of the plate portions 431, an arm portion 434 extends. The arm portion 434 is provided with a button portion 435, which is formed at the free end of the arm portion 434. The button portions 435 project inwardly in the Z-direction and face each other.

Figure 11:
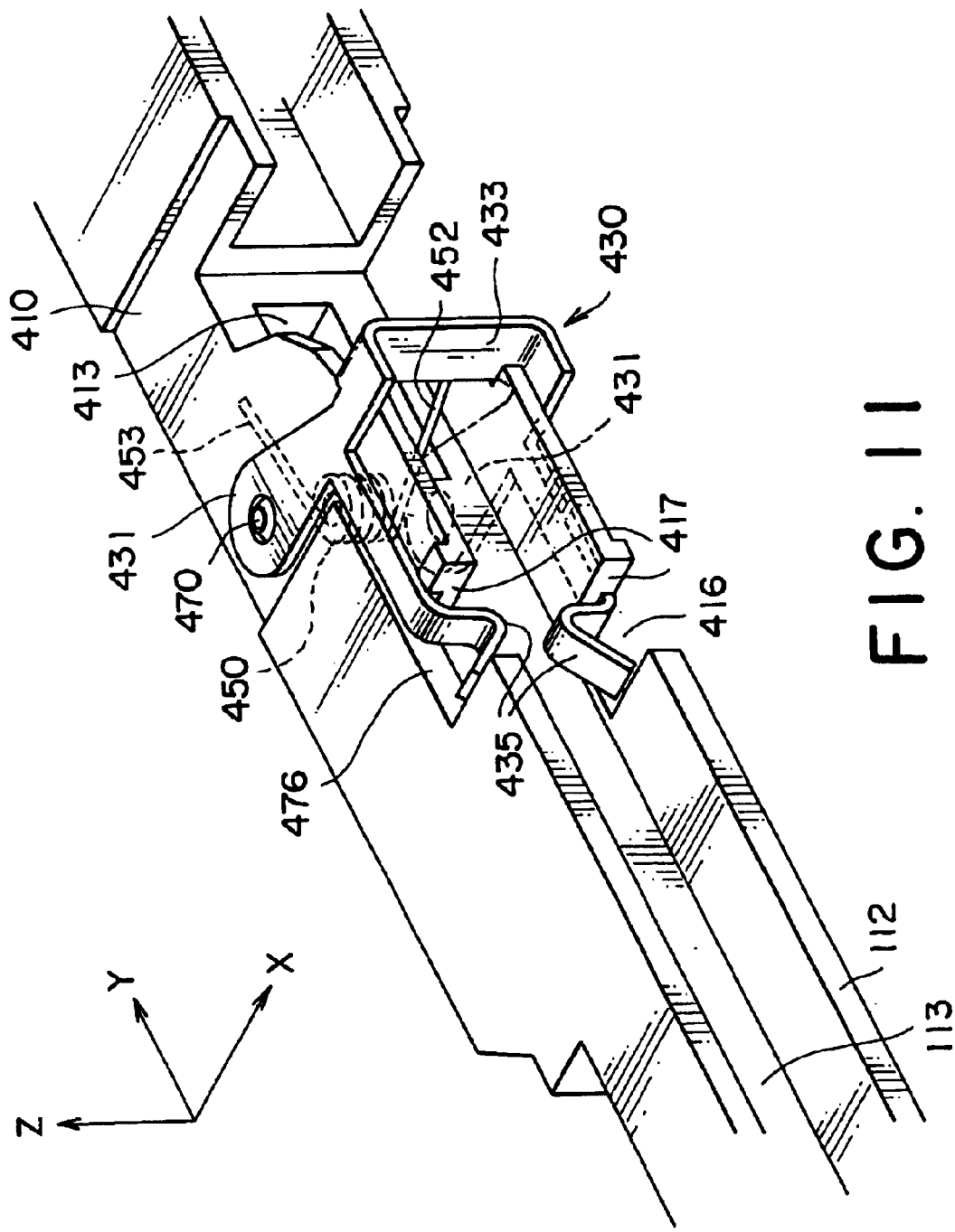
FIG. 11 is a partially-transparent, perspective view showing the mechanism of FIG. 9.

As shown in FIGS. 10 and 11, a torsion spring 450 is disposed in the room 413 so that a hole 451 of the torsion spring 450 is aligned with the holes 414 of the side portion 111 of the frame 110. One arm 453 of the torsion spring 450 is pressed against the sidewall of the room 413 in the X-direction, while the other arm 452 of the torsion spring 450 projects mainly in the X-direction. The plate portions 431 of the stopper 430 are arranged on the respective depressed portions 410. In other words, the plate portions 431 of the stopper 430 sandwich the side portion 111 of the frame 110. The holes 432 of the stopper 430 are rotatably supported by a shaft 470 which is inserted into the holes 414 of the side portion 111 of the frame.

Figure 9:
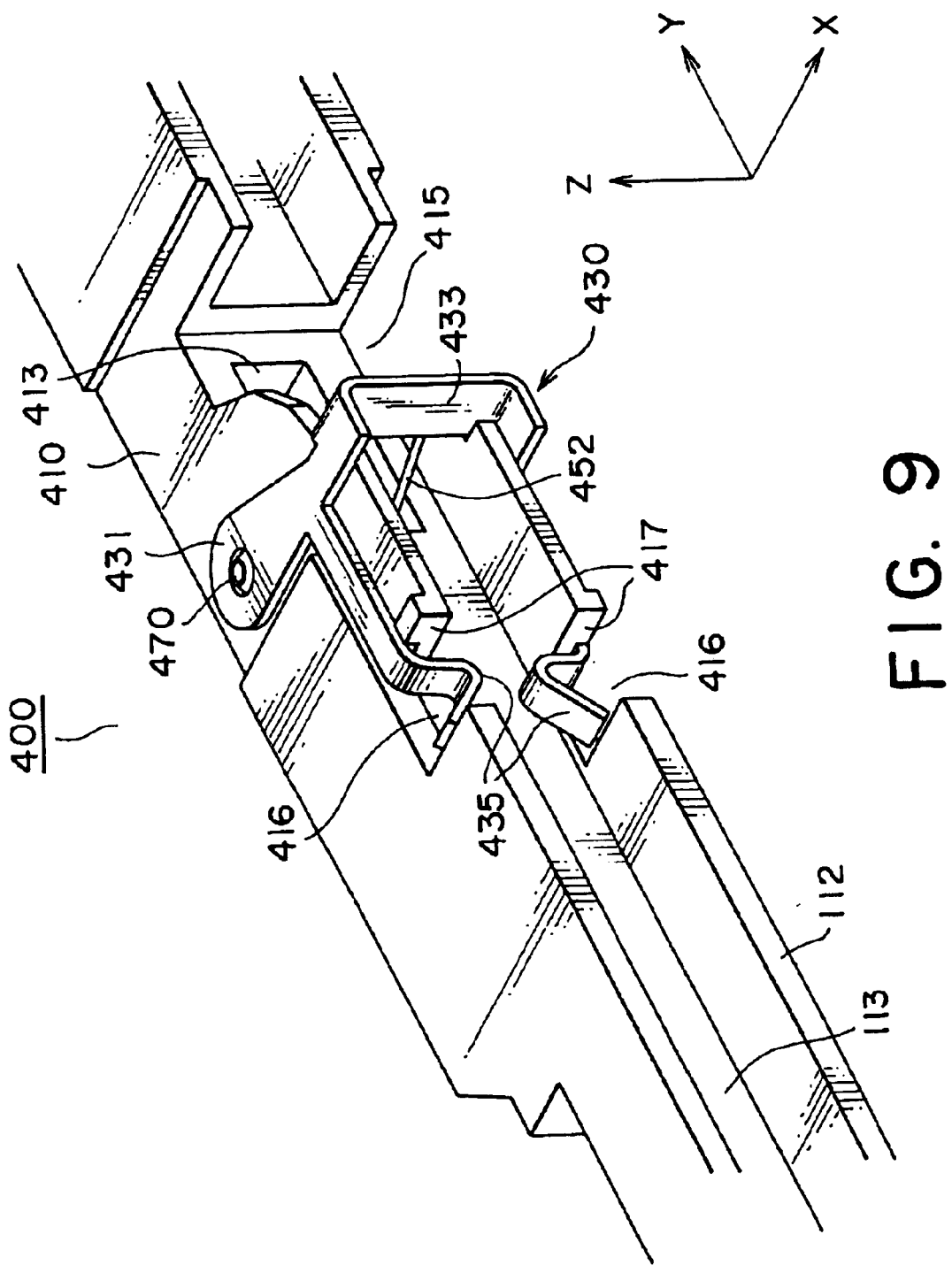
FIG. 9 is a perspective view showing a prevention mechanism of insertion of an unsuitable card in accordance with a second embodiment of the present invention.
Figure 13:
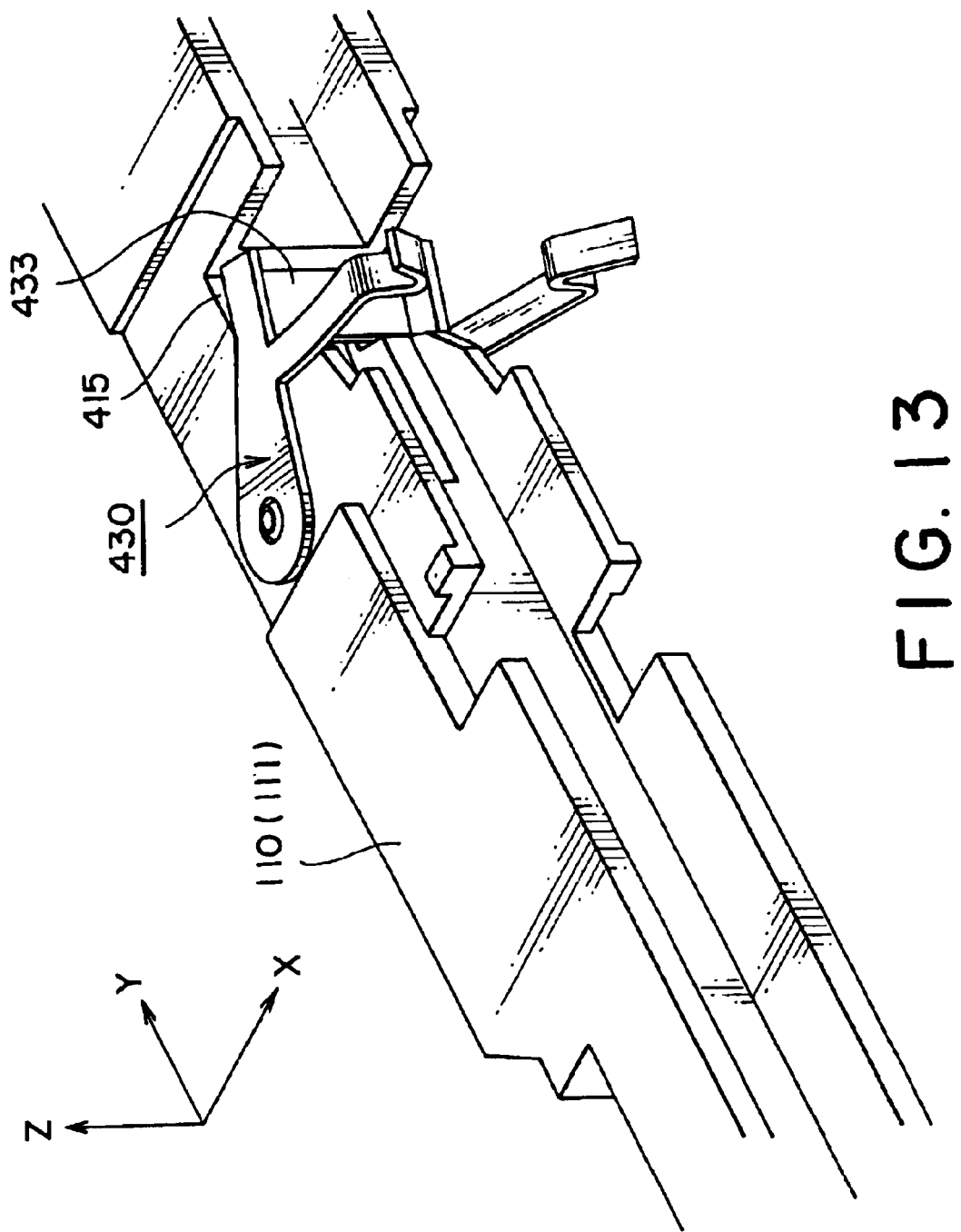
FIG. 13 is a perspective view showing the mechanism of FIG. 9, wherein the stopper is moved.

Like the first embodiment, the stopper 430 is able to move between the first position shown in FIG. 9 or 7 and the second position shown in FIG. 13. The arm 452 of the torsion spring 450 is pressed against the stopper portion 433 so that the stopper portion 433 is urged to be positioned at the first position. In this embodiment, the side portion 111 of the frame 110 is formed with two stopper edges 418 as shown in FIG. 10, the stopper portion 433 is regulated not to go beyond the first position towards the rear end of the card slot assembly 100.

When the stopper 430 is positioned at the first position, the stopper portion 433 traverses the guide groove 113, as shown in FIGS. 9 and 11. In this embodiment, the stopper portion 433 has a plate-like shape, which is laid on a plane perpendicular to the Y-direction when the stopper 430 is at the first position. In addition, as shown in FIGS. 9 and 11, when the stopper 430 is positioned at the first position, the button portions 435 of the stopper 430 engage with edges 417 of the cut-away like portions 416 of the side portion 111 of the frame 110 to lock the stopper 430 at the first position. In this meaning, the button portions 435 of the stopper 430 also serve as the locking means.

Figure 12:
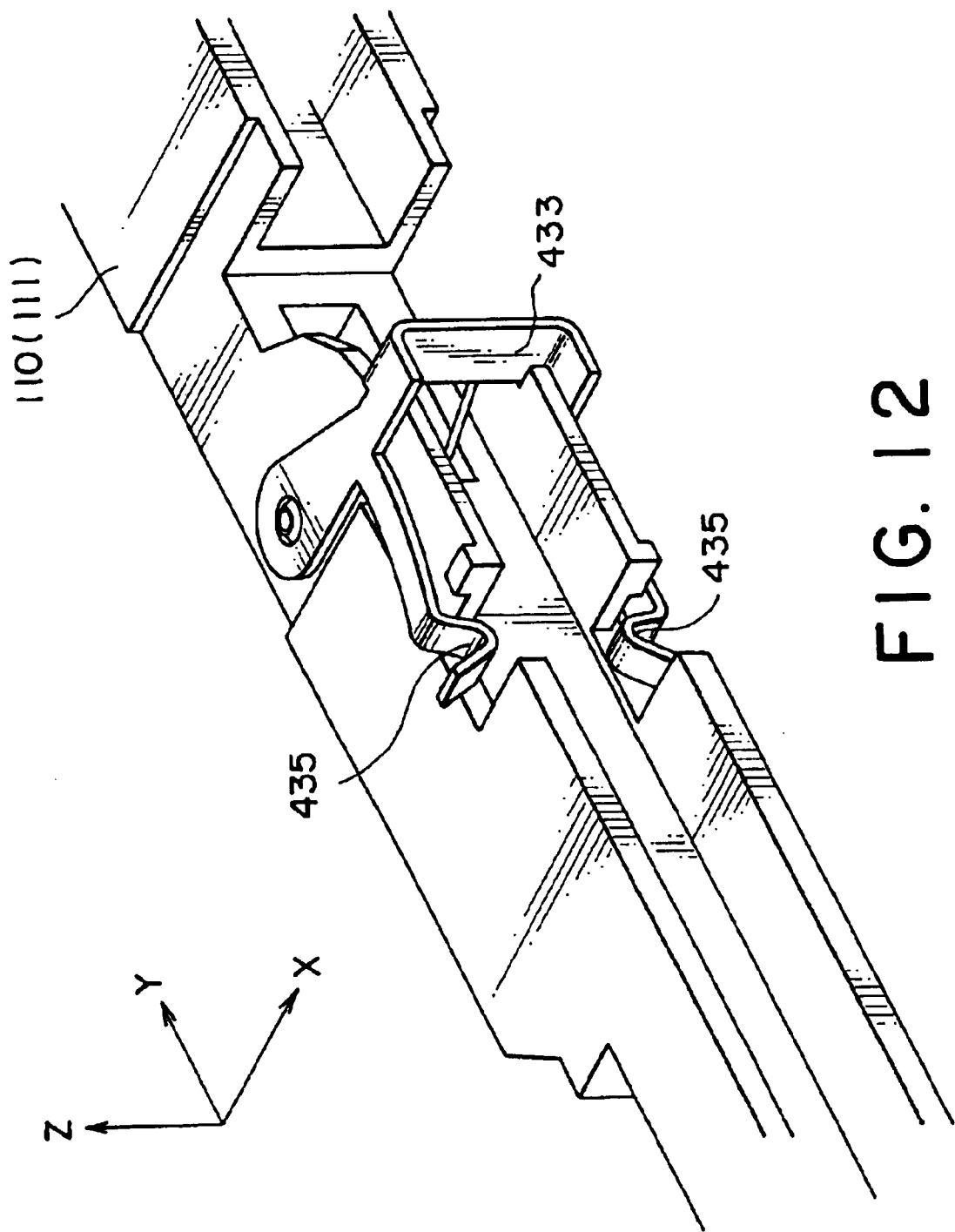
FIG. 12 is a perspective view showing the mechanism of FIG. 9, wherein the stopper is unlocked.

The minimum distance between the button portions 435 of the stopper 430 is set out in the similar manner of the first embodiment. Therefore, if the PC card is inserted into the card slot 160, both of the button portions 435 are pressed by the PC card. As shown in FIG. 12, when the both of the button portions 435 are pressed outwardly from the guide groove 113 in the Z-direction, they are released from the edges 417 of the cut-away like portions 416 of the side portion 111 of the frame 110 so that the stopper 430 is allowed to move towards the second position. Otherwise, the stopper 430 is still locked at the first position by at least one of the button portions 435.

If both of the button portions 435 are released from the cut-away like portions 416, when the PC card is further inserted along the guide groove 113, the stopper 430 is pressed by the PC card and is moved to the second position, as shown in FIG. 13. Similar to the first embodiment, when the stopper 430 is positioned at the second position, the stopper 430 does not obstruct the guide groove 113 so that the PC card can be further inserted and be received in the card slot assembly 100.

Figure 14:
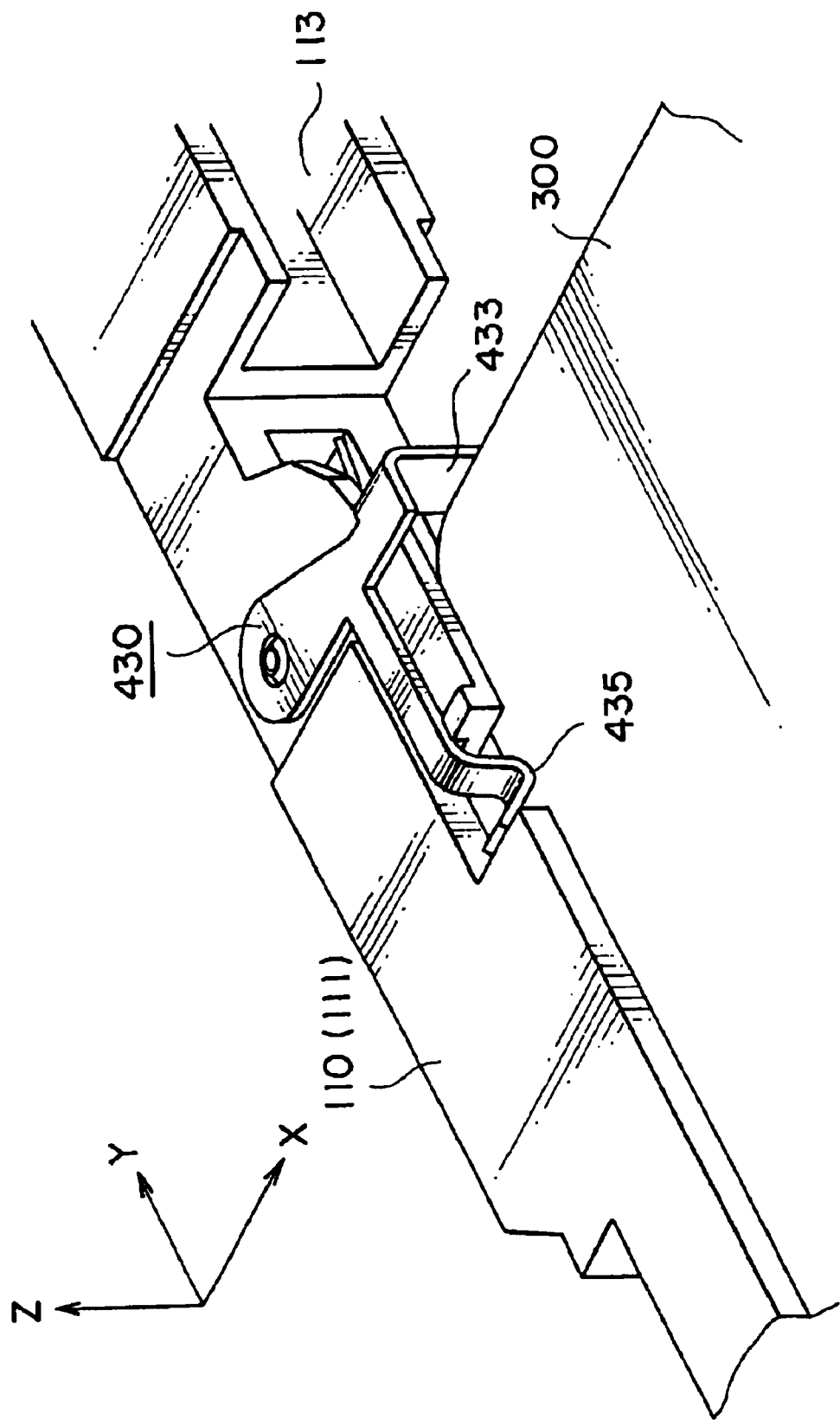
FIG. 14 is a perspective view showing the mechanism of FIG. 9, wherein insertion of an unsuitable card is stopped by the stopper.

As shown in FIG. 14, even if the smart card 300 is inserted along the guide groove 113 by error, the smart card 300 bumps against the stopper 430 locked at the first position. Therefore, the smart card 300 is prevented from further entering over the stopper 430.

With reference to FIGS. 15 to 20, a mechanism 600 according to a third embodiment of the present invention is different from the first and the second embodiments in that the mechanism 600 comprises two stoppers 621, 622 which are controlled independently of each other.

Figure 16:
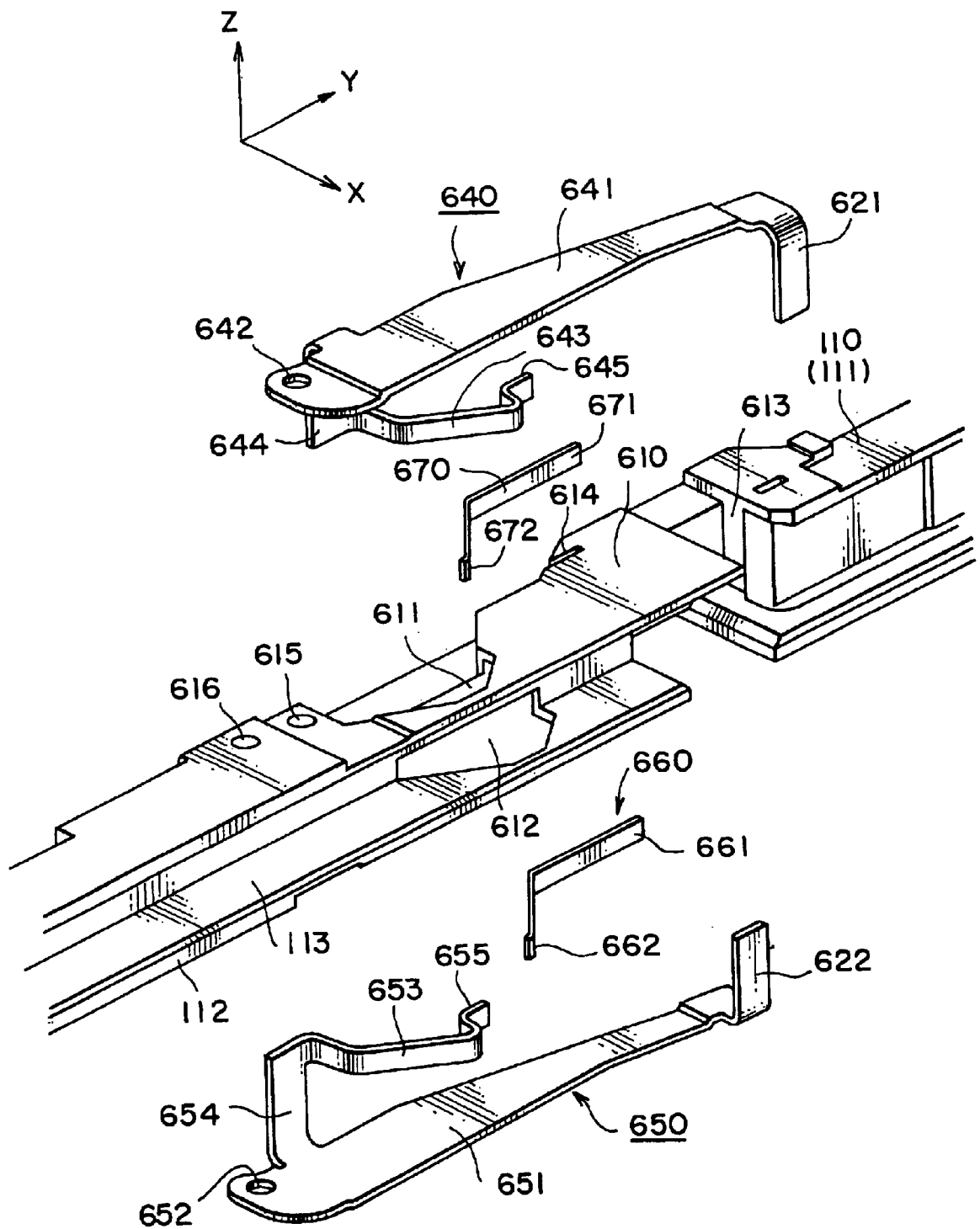
FIG. 16 is an exploded, perspective view showing the mechanism of FIG. 15.

As shown in FIG. 16, on the opposite surfaces of the side portion 111 of the frame 110 in the Z-direction, there are depressed portions 610. The depressed portions 610 communicate with the guide groove 113 via apertures 611, 612. At a position away from the apertures 611, 612, a space 613 is formed in the side portion 111 of the frame 110. The space 613 is depressed outwardly from the guide groove 113 in the X-direction. Between the space 613 and the upper aperture 611 in the Y-direction, an upper slit 614 is formed in the side portion 111 of the frame 110. The position of the upper slit 614 is the outside of the upper aperture 611 in the X-direction and is similar to the upper aperture 611 in the Z-direction. The side portion 111 of the frame 110 is also formed with a lower slit between the space 613 and the lower aperture 612, but the lower slit is not shown in the drawings. At a position nearer to the rear end of the frame 110 than the apertures 611, 612, a through hole 615 and a through hole 616 are formed in the side portion 111 of the frame 110.

Figure 15:
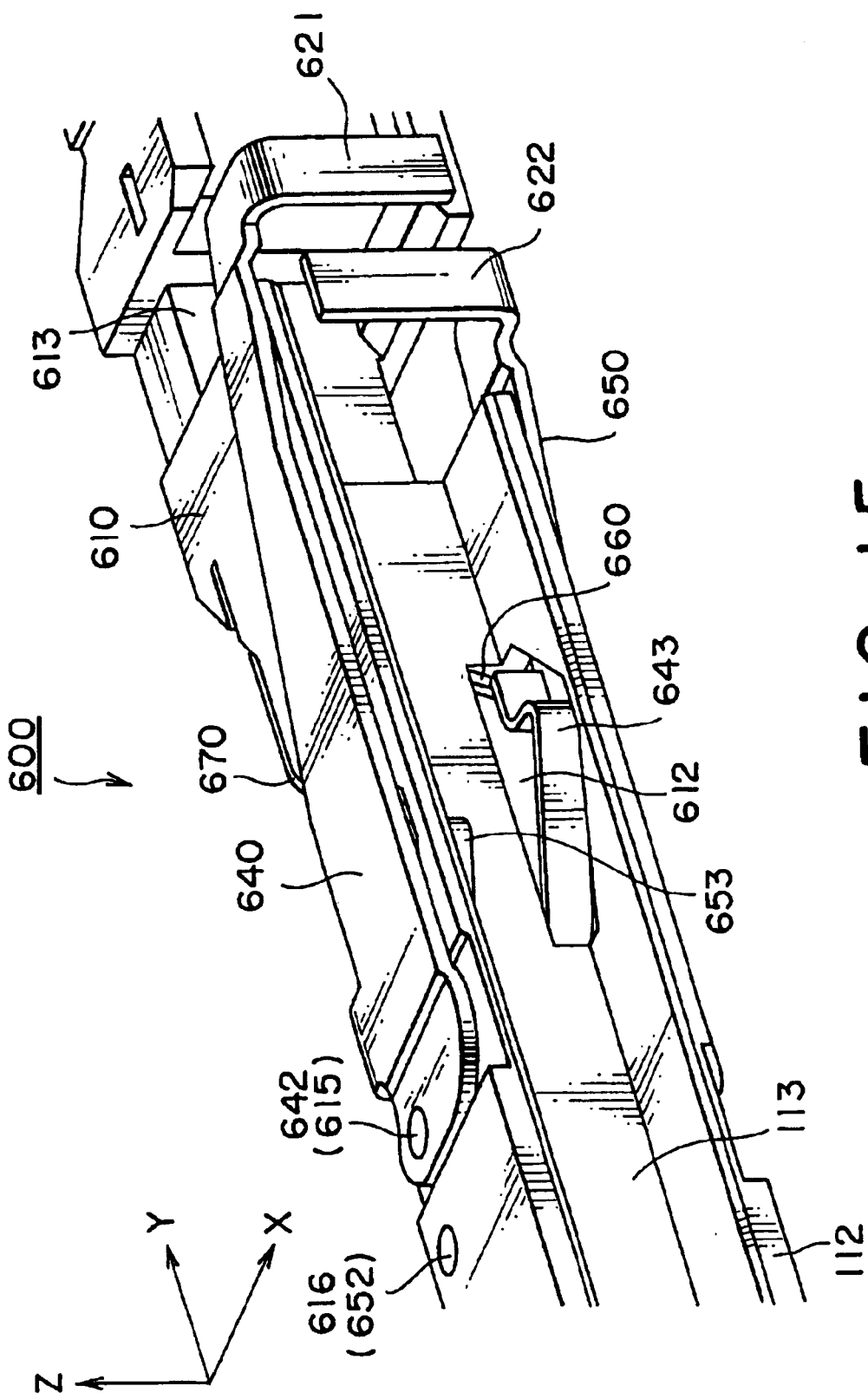
FIG. 15 is a perspective view showing a prevention mechanism of insertion of an unsuitable card in accordance with a third embodiment of the present invention.

As shown in FIGS. 15 and 16, the mechanism 600 according to the third embodiment comprises first and second parts 640, 650 and first and second spring pieces 660, 670.

The first part 640 has a long arm 641. At an end of the arm 641, the stopper 621 is provided. The arm 641 has a hole 642, which is formed at the other end of the arm 641. The first part 640 has a first button portion 643, which is apart from the arm 641 in the Z-direction. The button portion 643 and the arm 641 are connected to each other by a connection portion 644. The hole 642 is aligned with the hole 615 by a shaft not shown, so that the first part 640 is rotatably supported by the shaft.

When the first part 640 rotates around the hole 642, the stopper 621 moves mainly in the X-direction. Because the arm 641 is very long in the Y-direction in comparison with the movable distance of the stopper 621, the arm 641 substantially prevents the stopper 621 from moving in the Y-direction. Like the first or the second embodiment, the movable range of the stopper 621 is between the first position shown in FIG. 15 and the second position where the stopper 621 is completely accommodated in the space 613.

Figure 17:
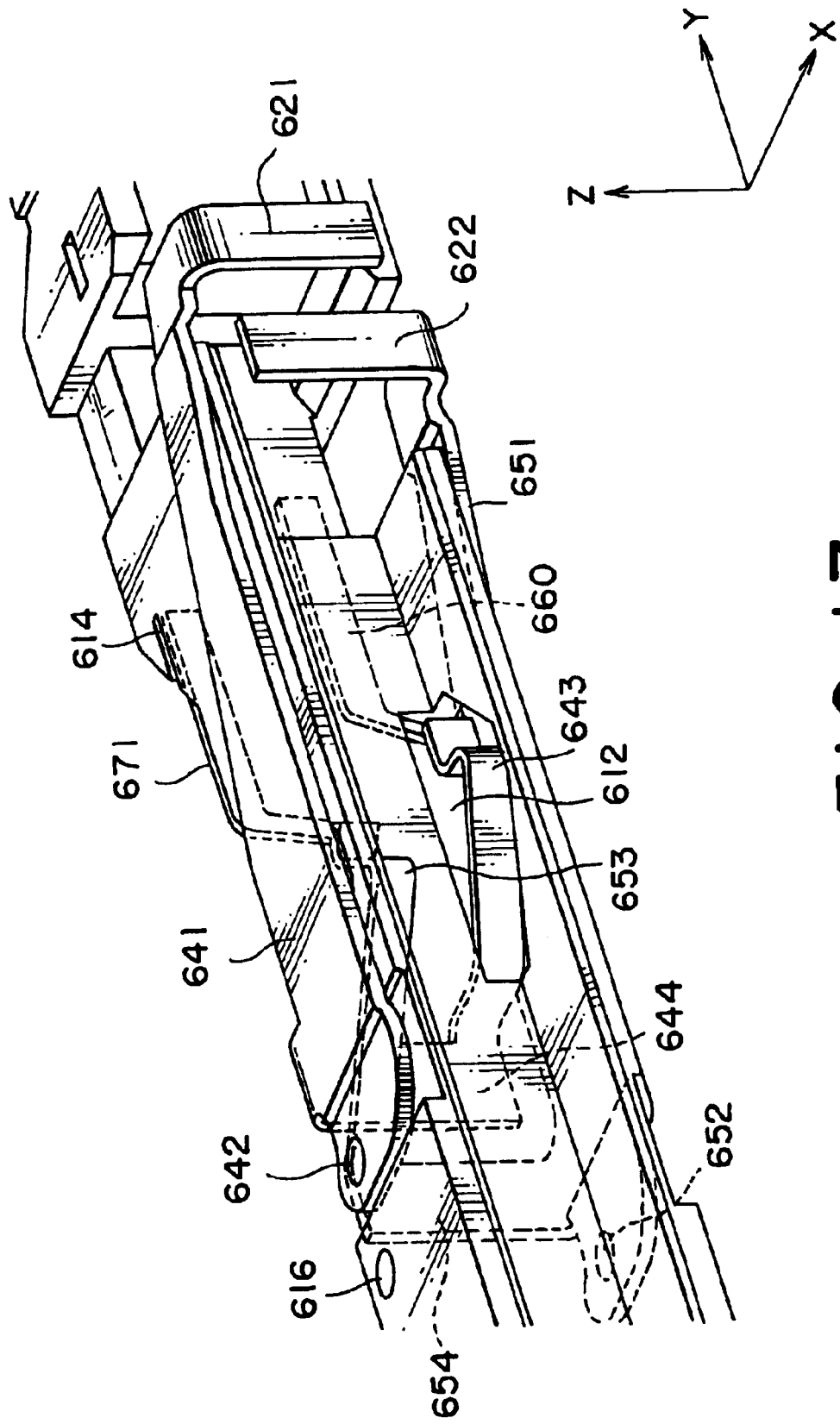
FIG. 17 is a partially-transparent, perspective view showing the mechanism of FIG. 15.

As shown in FIGS. 15 and 17, the button portion 643 is positioned within the lower aperture 612. At the outside of the button portion 643 in the X-direction, the first spring piece 660 is arranged. One end 661 of the spring piece 660 is fitted within the lower slit not shown, while the other end 662 is brought into contact with the free end 645 of the button portion 643. See FIG. 18. By this arrangement, the button portion 643 is urged to project inwardly in the X-direction. When the button portion 643 projects in the guide groove 113, the stopper 621 is positioned at the first position. When the button portion 643 is pressed outwardly in the X-direction, the first part 640 rotates around the hole 642 so that the stopper 621 is accommodated in the space 613 and is positioned at the second position.

Similar to the first part 640, the second part 650 has an arm 651. At an end of the arm 651, the stopper 622 is provided. The arm 651 has a hole 652, which is formed at the other end of the arm 651. The second part 650 has a second button portion 653, which is apart from the arm 651 in the Z-direction. The button portion 653 and the arm 651 are connected to each other by a connection portion 654. The hole 652 is aligned with the hole 616 by another shaft not shown, so that the second part 650 is rotatably supported by the shaft.

Like the stopper 621, the movable range of the stopper 622 is between the first position shown in FIG. 15 and the second position where the stopper 622 is completely accommodated in the space 613. The arm 651 regulates the movement of the stopper 622 and prevents the stopper from moving in the Y-direction so that the stopper is allowed to mainly move in the X-direction, similar to the stopper 621.

As seen from FIGS. 15 to 17, the button portion 653 is positioned within the upper aperture 611. At the outside of the button portion 653 in the X-direction, the second spring piece 670 is arranged. One end 671 of the spring piece 670 is fitted within the upper slit 614, while the other end 672 is brought into contact with the free end 655 of the button portion 653. See FIG. 18. By this arrangement, the button portion 653 is urged to project inwardly in the X-direction, as shown in FIG. 15. When the button portion 643 projects in the guide groove 113, the stopper 621 is positioned at the first position. When the button portion 643 is pressed outwardly in the X-direction, the first part 640 rotates around the hole 642 so that the stopper 621 is accommodated in the space 613 and is positioned at the second position.

Figure 18:
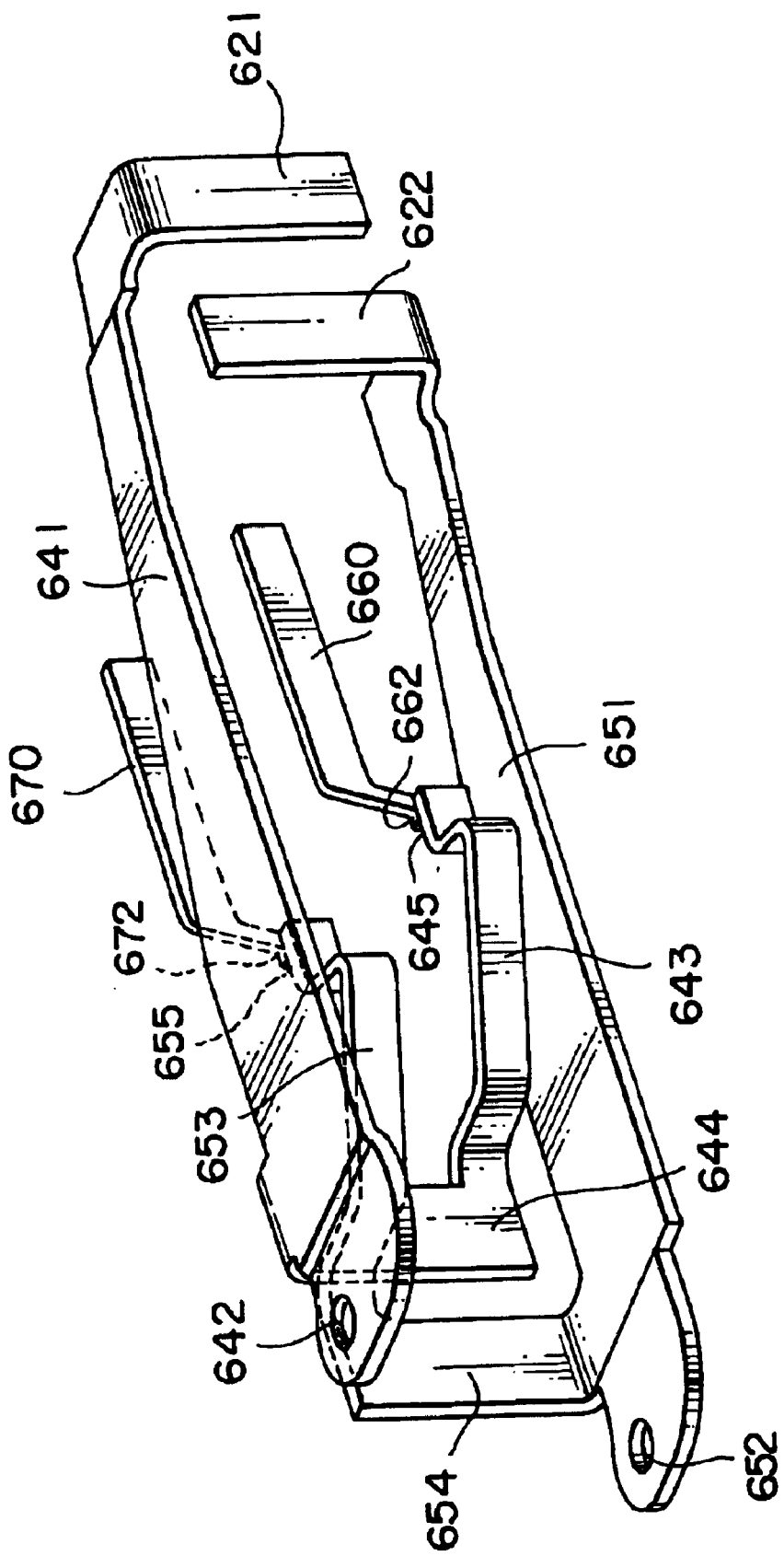
FIG. 18 is a perspective view showing the mechanism of FIG. 15, wherein a frame is removed.
Figure 19:
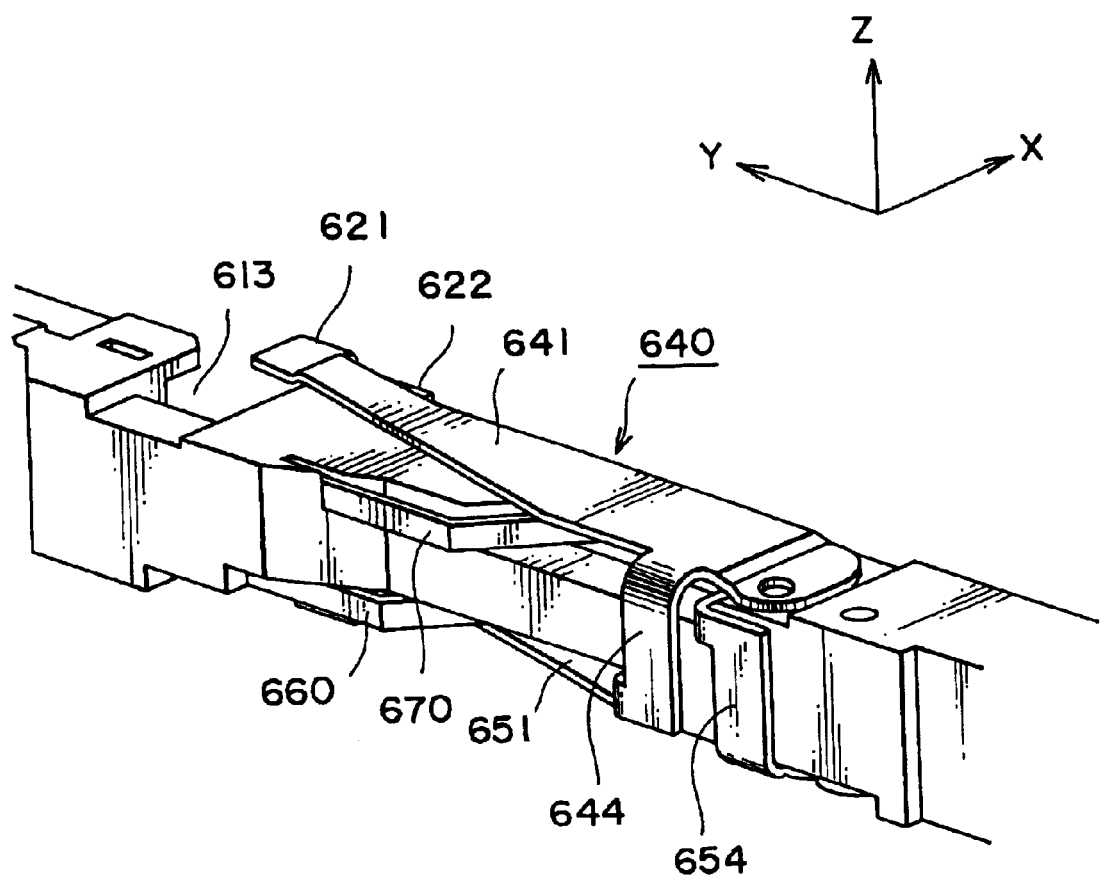
FIG. 19 is a perspective view showing the mechanism of FIG. 15, as seen from an outside of the frame.
Figure 20:
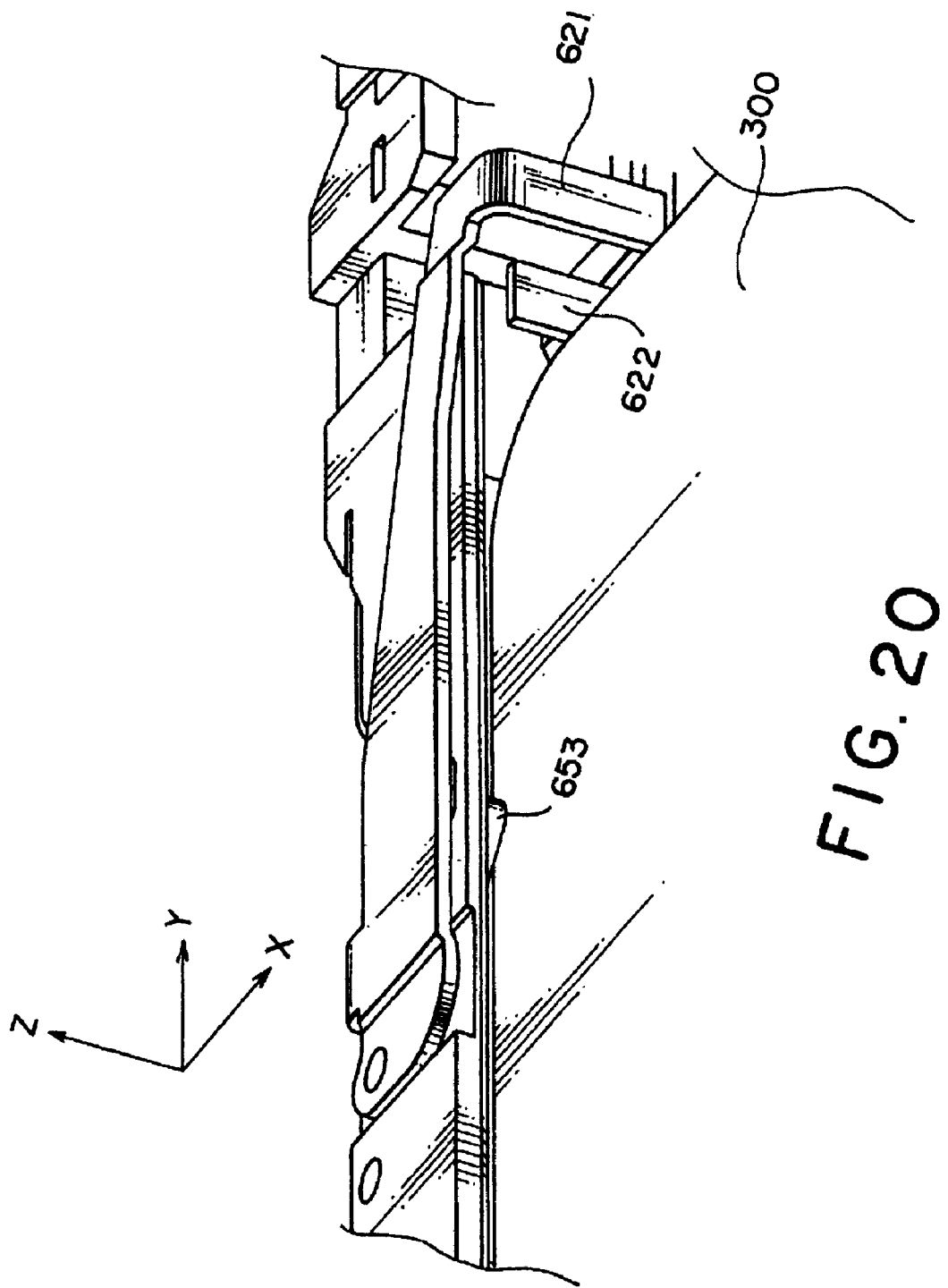
FIG. 20 is a perspective view showing the mechanism of FIG. 15, wherein insertion of an unsuitable card is stopped by the stopper.

In this embodiment, the positions of the button portions 643, 653 in the Y-direction are different from each other, as shown in FIGS. 15, 17 and 18. Also, the positions of the stoppers 621, 622 in the Y-direction are different from each other. The distance between the button portions 643, 653 is set out to the same value as the minimum distance in the first or the second embodiment. Therefore, when the PC card is inserted into the assembly 100, both of the button portions 643, 653 are pressed. In other words, both of the stoppers 621, 622 are accommodated in the space 613 only when both of the button portions 643, 653 are pressed outwardly in the X-direction. As shown in FIG. 20, when the smart card 300 is inserted into the assembly 100, the button portions 643, 653 cannot be pressed simultaneously. Therefore, at least one of the stoppers 621, 622 is still positioned at the first position and prevents the smart card 300 from entering the stopper 621 or 622.

With reference to FIGS. 21 to 24, a mechanism 800 according to a fourth embodiment of the present invention has more complex structure than the third embodiment but is based on the quite similar principle to the third embodiment.

Figure 22:
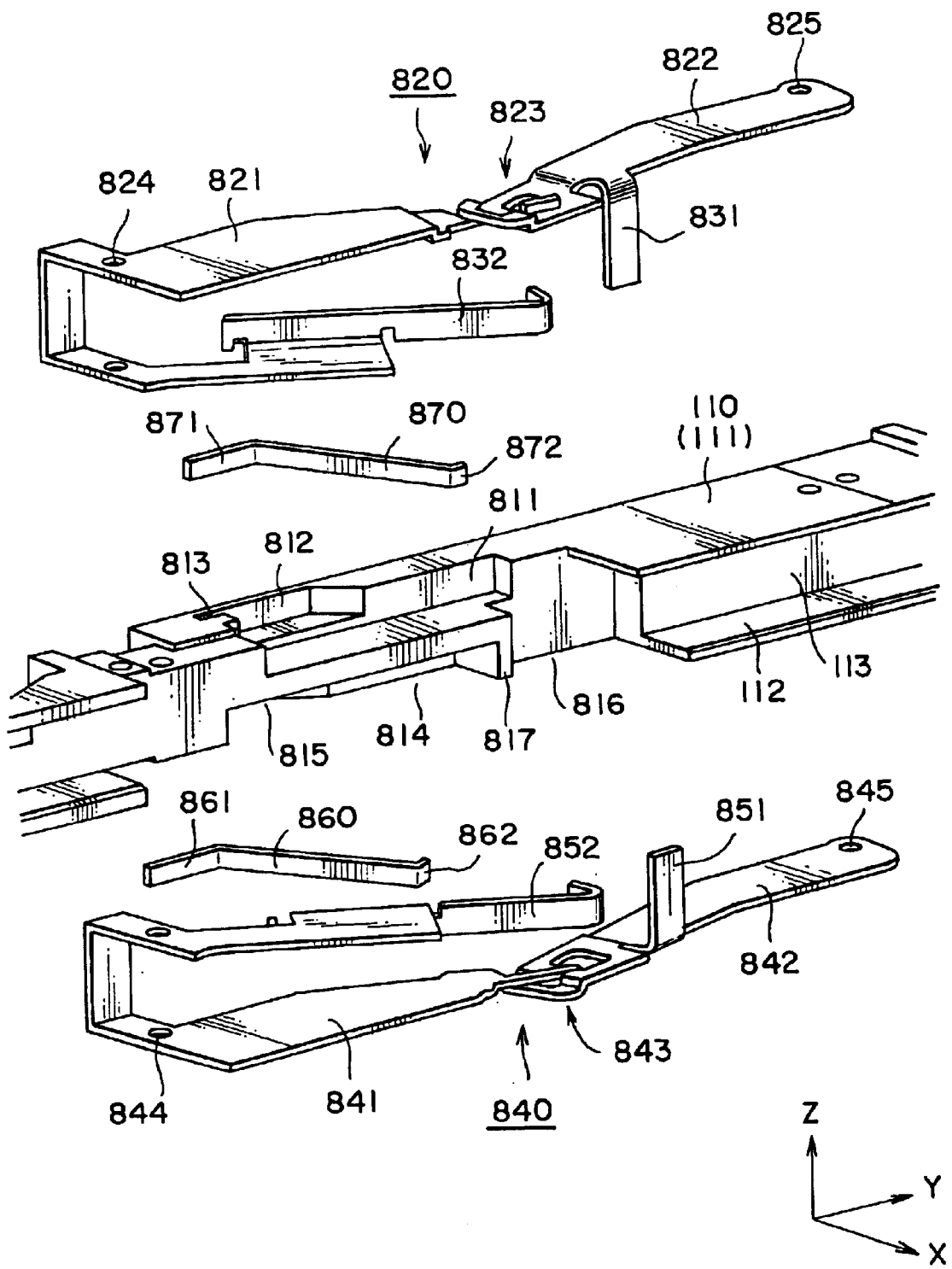
FIG. 22 is an exploded, perspective view showing the mechanism of FIG. 21.

As shown in FIG. 22, the side portion 111 of the frame 110 is provided with a first recess 811, which is depressed from the guide groove 113 outwardly in the X-direction. The first recess 811 extends in the Y-direction, and the rear half of the first recess 811 communicates with a second recess 812, which is positioned outside the first recess 811 in the X-direction. The second recess 812 continues to an upper slit 813. Like the first and the second recesses 811, 812 and the upper slit 813, the side portion 111 of the frame 110 is also provided with a third recess 814, a fourth recess 815 and a lower slit, which is however not shown in the drawings.

The side portion 111 of the frame 110 is further provided with a space 816, which is depressed from the guide groove 113 outwardly in the X-direction. The space 816 communicates with the first recess 811 but is separated from the third recess 814 by a wall 817.

Figure 21:
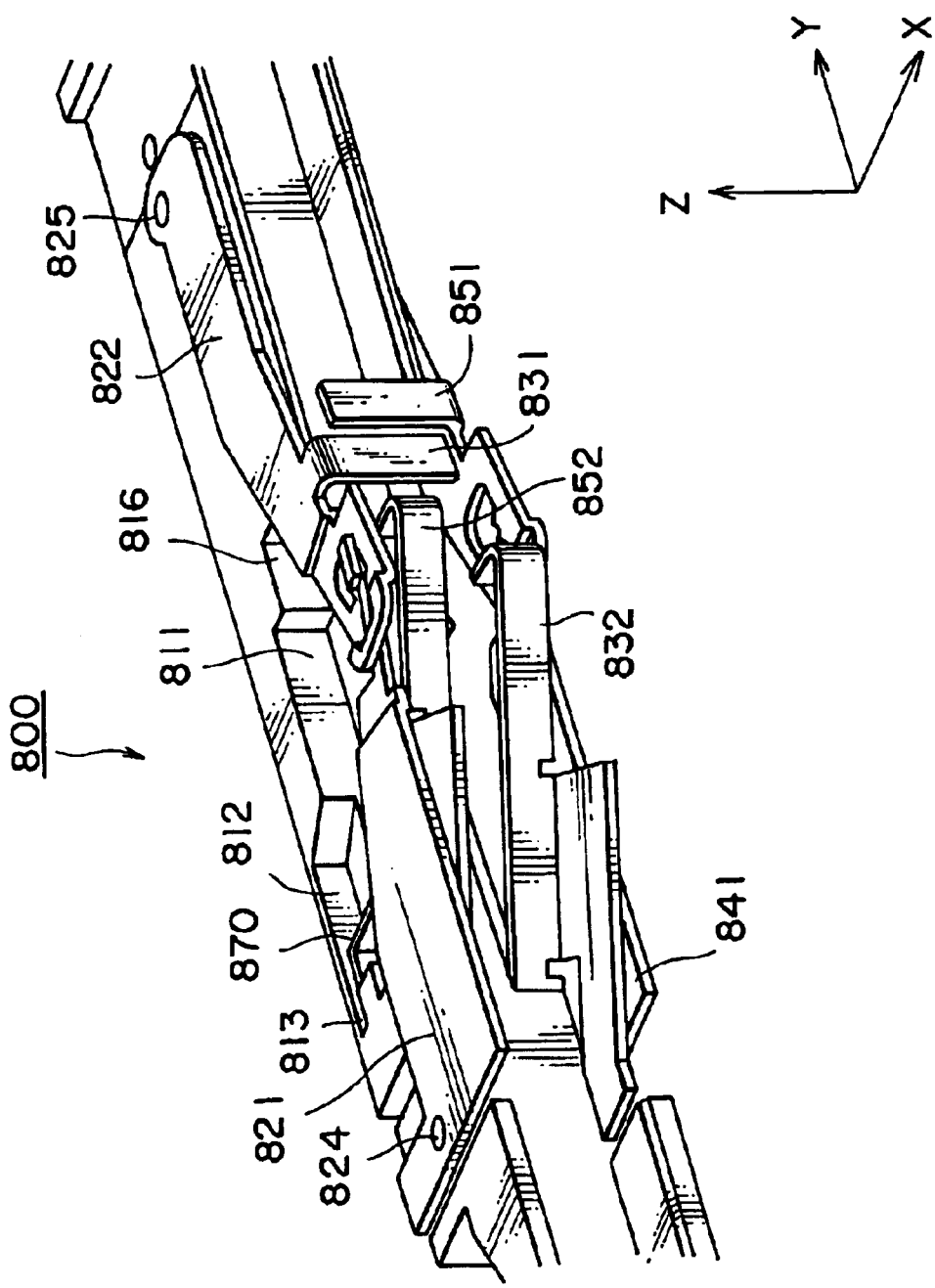
FIG. 21 is a perspective view showing a prevention mechanism of insertion of an unsuitable card in accordance with a fourth embodiment of the present invention.

As seen from FIGS. 21 and 22, the mechanism 800 according to the fourth embodiment comprises first and second combinations 820, 840 and first and second spring pieces 860, 870. The first and the second spring pieces 860, 870 have the same functions as the first and the second spring pieces 660, 670 of the third embodiment. One end 861 of the first spring piece 860 is fitted to the lower slit so that the first spring piece 860 is mainly accommodated in the fourth recess 815. Similarly, one end 871 of the second spring piece 870 is fitted to the upper slit 813 so that the second spring piece 870 is mainly accommodated in the second recess 812.

As shown in FIG. 22, the first combination 820 has two parts 821, 822, which are jointed. At this joint 823, the part 821 has a narrow end with a stopper bar and is inserted into a hole of the part 822. The joint 823 between the parts 821 and 822 is slightly contractible in the Y-direction. However, the joint 823 is only allowed to move in the X-direction because the parts 821, 822 prevent the joint 823 from moving in the Y-direction. The parts 821, 822 rotate around holes 824, 825, which are rotatably fixed on the side portion 111 of the frame 110.

The part 822 is formed integral with a stopper 831 which extends in the Z-direction. Based on the movement prevention of the joint 823, the stopper 832 is substantially prevented from moving in the Y-direction so that the stopper 832 is allowed to move in the X-direction between a first position shown in FIG. 21 and a second position shown in FIG. 23.

Figure 23:
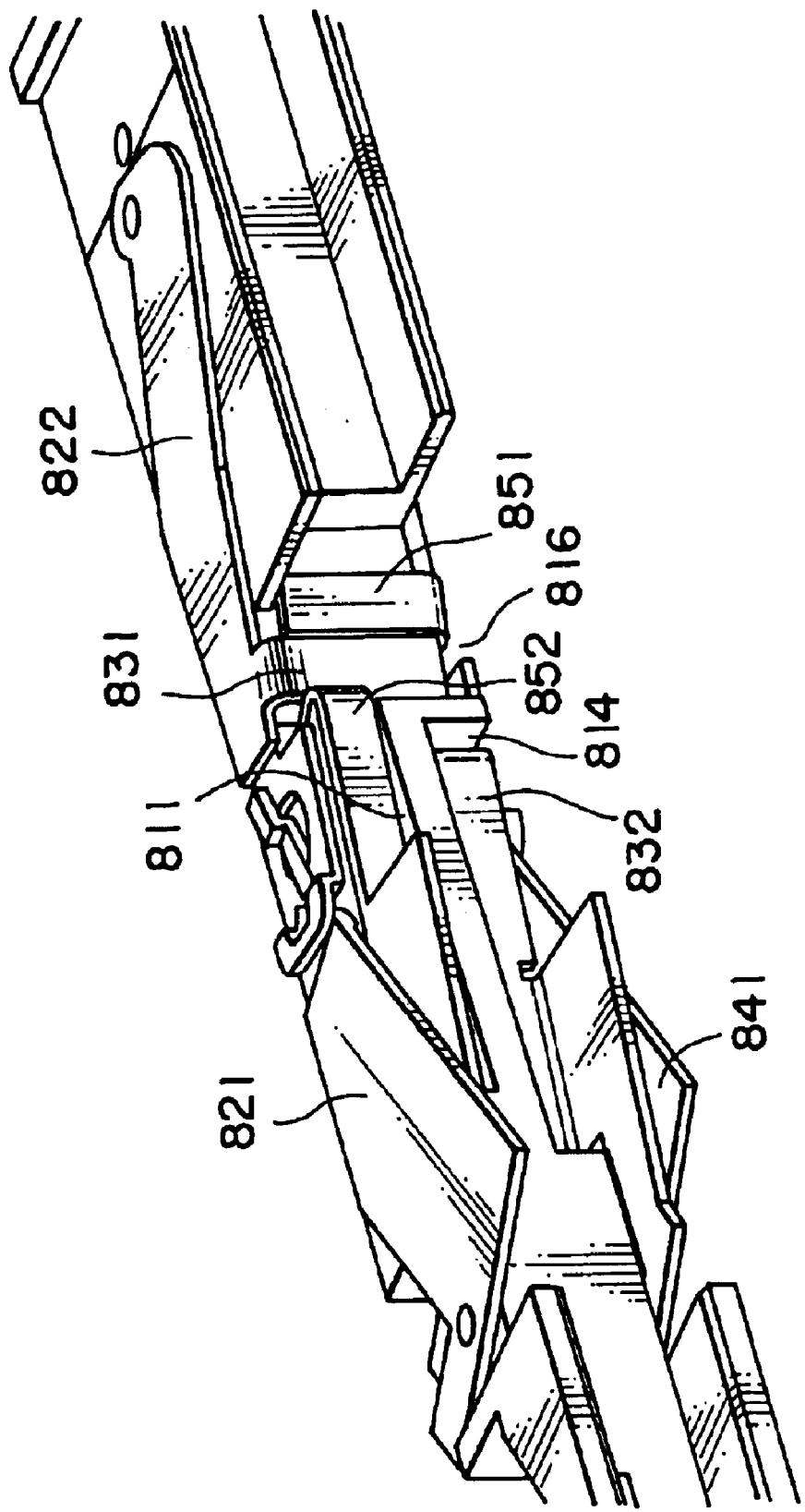
FIG. 23 is a perspective view showing the mechanism of FIG. 21, wherein the stopper is moved.

The part 831 is formed integral with a button portion 832. As seen from FIGS. 21 and 22, the button portion 832 is disposed within the third recess 814. The end 862 of the spring piece 860 is brought into contact with the backside of the button portion 832 so that the button portion 832 is urged to project in the guide groove 113 in the X-direction. As shown in FIG. 21, when the button portion 832 projects in the guide groove 113, the stopper 831 is positioned at the first position so that the stopper 831 transverses the guide groove 113 in the Z-direction. As shown in FIG. 23, when the button portion 832 is pressed and is accommodated in the third recess 814, the stopper 831 is accommodated in the space 816 and is positioned at the second position.

The second combination 840 has a structure similar to the first combination 820, as seen from FIG. 22. The second combination 840 has two parts 841, 842. The joint 843 between the parts 841 and 842 is slightly contractible in the Y-direction and is movable in the X-direction. The parts 841, 842 rotate around holes 844, 845, which are rotatably fixed on the side portion 111 of the frame 110.

The part 842 is formed integral with a stopper 851 which extends in the Z-direction. The stopper 852 is substantially prevented from moving in the Y-direction so that the stopper 852 is allowed to move in the X-direction between a first position shown in FIG. 21 and a second position shown in FIG. 23.

The part 841 is formed integral with a button portion 852. As seen from FIGS. 21 and 22, the button portion 852 is disposed within the first recess 811. The end 872 of the spring piece 870 is brought into contact with the backside of the button portion 852 so that the button portion 852 is urged to project in the guide groove 113 in the X-direction. As shown in FIG. 21, when the button portion 852 projects in the guide groove 113, the stopper 851 is positioned at the first position so that the stopper 851 transverses the guide groove 113 in the Z-direction. As shown in FIG. 23, when the button portion 852 is pressed and is accommodated in the first recess 811, the stopper 851 is accommodated in the space 816 and is positioned at the second position. The position control of the stopper 851 is achieved independently of that of the stopper 831.

Figure 24:
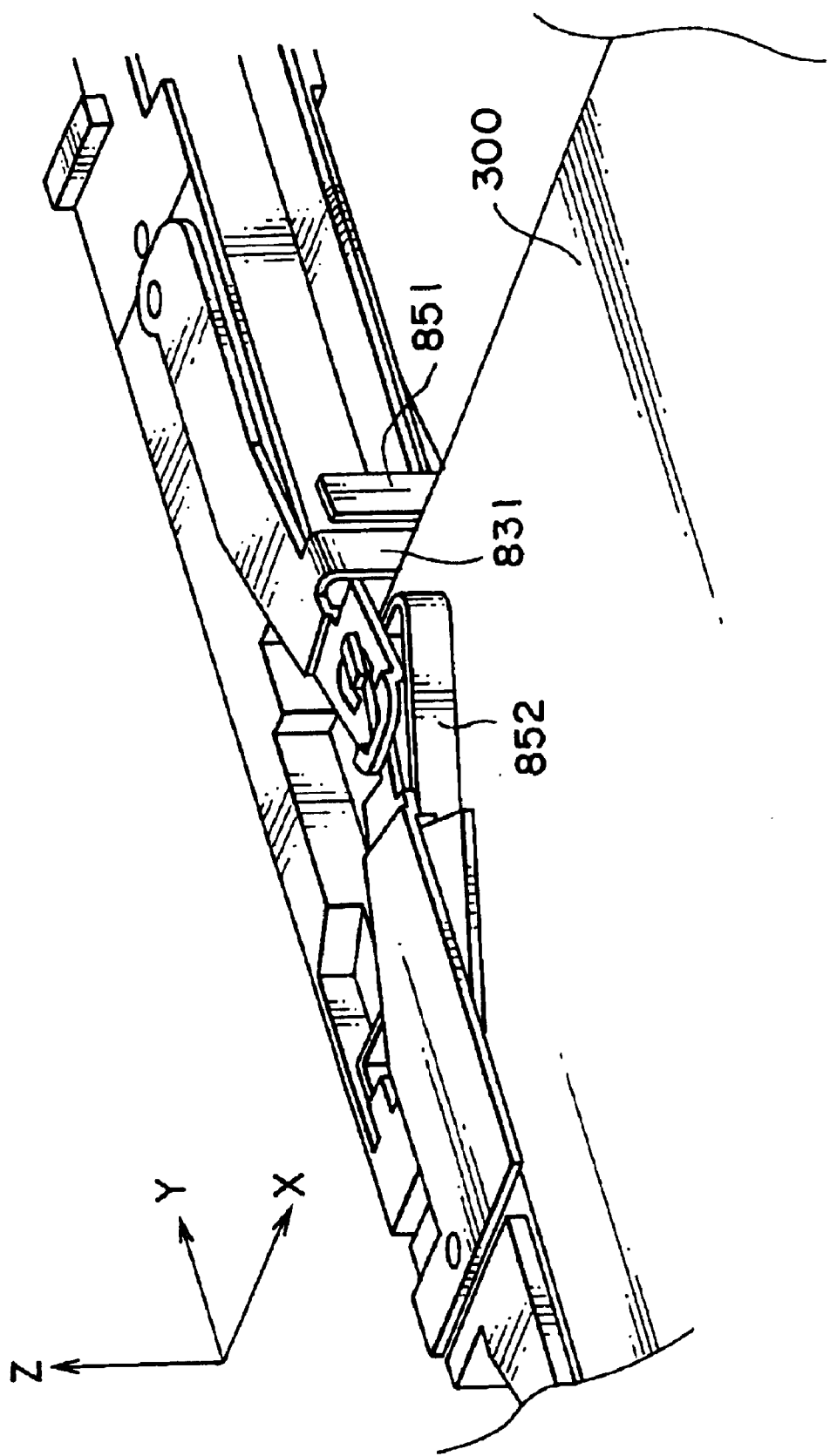
FIG. 24 is a perspective view showing the mechanism of FIG. 21, wherein insertion of an unsuitable card is stopped by the stopper.

With the above structure, only when both of the button portions 832, 852 are pressed and are accommodated in the first and the third recesses 811, 814, the stoppers 831, 851 are accommodated in the space 816. However, if at least one of the button portions 832, 852 is not pressed and is not accommodated in the corresponding recess 811, 814, one of the stoppers 831, 851 is still positioned within the guide groove 113 to traverse the guide groove 113. Therefore, as shown in FIG. 24, even when the smart card 300 is inserted into the assembly 100 by error, at least one of the stoppers 831, 851 is still positioned at the first position and prevents the smart card 300 from entering the stopper 831, 851.

What is claimed is:

1. A card slot assembly which is able to receive a card and comprises:

a frame, which is provided with a guide groove, wherein the guide groove is arranged at an inner side of the frame in a first direction and extends in a second direction perpendicular to the first direction, and the guide groove is formed with an accommodation space, which is outwardly depressed in the first direction;

stopper means, which is movably held by the frame, wherein a movable range of the stopper means is between first and second positions, the first position being a position where the stopper means traverses the guide groove in a third direction perpendicular to the first and the second directions, the second position being a position where the stopper means is accommodated in the accommodation space;

button means, which is positioned in the guide groove and is linked with the stopper means, so that, when the button means is pressed, the stopper means is moved to the second position.

2. The card slot assembly according to claim 1, wherein the button means is comprised of two button portions, which are opposite to each other in the third direction, wherein the stopper means is allowed to move to the second position only when both of the button portions are pressed.

3. The card slot assembly according to claim 2, which is able to receive a first type card and a second type card, the first type card being thicker than the second types card, wherein the guide groove is for guiding insertion of the first type card, and the button portions are positioned apart from each other in the third direction by a predetermined distance, which is larger than a thickness of the second type card.

4. The card slot assembly according to claim 3, further comprising locking means for locking the stopper means at the first position, wherein the button portions are connected to the locking means.

5. The card slot assembly according to claim 4, further comprising a shaft which is held by the frame, wherein the stopper means is a single stopper which is rotatably supported by the shaft.

6. The card slot assembly according to claim 5, wherein: the stopper is formed with two engagement recesses which are opposite to each other in the third direction; the locking means is comprised of two engagement portions, which are able to engage with the respective engagement recesses and are formed integral with the respective button portions; and the button portions project in the third direction and face each other.

7. The card slot assembly according to claim 5, wherein: the frame is formed with two engagement portions which are opposite to each other in the third direction; the button portions project from the frame towards an inside of the guide groove and face each other; the button portions serve as the locking means and are able to engage with the respective engagement portions of the frame; and the button portions are formed integral with the stopper.

8. The card slot assembly according to claim 3, further comprising preventing means for preventing the stopper means from moving from the first position in the second direction, so that the stopper means is substantially allowed to move only in the first direction.

9. The card slot assembly according to claim 8, wherein: the button portions project from the frame towards an inside of the frame in the first direction; and the stopper means is comprised of two stoppers, which extend in the third direction, respectively, and are connected to the respective button portions so that, when each of the button portions is pressed in the first direction, the corresponding stopper goes in the accommodation space.

10. The card slot assembly according to claim 9, wherein the button portions are positioned at different positions from each other in the second direction, and the stoppers are positioned at different positions from each other in the second direction.

11. The card slot assembly according to claim 1, further comprising urging means for urging the stopper means to be positioned at the first position.

* * * * *

UNITED STATES PATENT AND TRADEMARK OFFICE
CERTIFICATE OF CORRECTION

PATENT NO. : 6,764,323 B2
DATED : July 20, 2004
INVENTOR(S) : Shimada et al.

It is certified that error appears in the above-identified patent and that said Letters Patent is hereby corrected as shown below:

Title page,
Item [73], Assignee, should read:
-- Japan Aviation Electronics Industry, Limited, Tokyo (JP) --.

Signed and Sealed this

Twenty-third Day of November, 2004

JON W. DUDAS
*Director of the United States Patent and Trademark Office*